(12) United States Patent
Nakamura et al.

(10) Patent No.: US 7,351,131 B2
(45) Date of Patent: Apr. 1, 2008

(54) METHOD FOR MANUFACTURING SEMICONDUCTOR DEVICE AND POLISHING APPARATUS

(75) Inventors: Kenro Nakamura, Kamakura (JP); Naoto Miyashita, Yokohama (JP); Takashi Yoda, Machida (JP); Katsuya Okumura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/178,318

(22) Filed: Jul. 12, 2005

(65) Prior Publication Data

US 2005/0250423 A1 Nov. 10, 2005

Related U.S. Application Data

(62) Division of application No. 10/303,001, filed on Nov. 25, 2002, now Pat. No. 6,933,234.

(30) Foreign Application Priority Data

Nov. 26, 2001 (JP) ............................. 2001-359818

(51) Int. Cl.
*B24B 1/00* (2006.01)
(52) U.S. Cl. .................................... 451/296
(58) Field of Classification Search ............. 451/303, 451/43, 44, 307, 309, 9, 297, 299, 41, 57, 451/59, 283, 284, 285, 286, 296
See application file for complete search history.

(56) References Cited

U.S. PATENT DOCUMENTS

| | | | |
|---|---|---|---|
| 4,084,356 A * | 4/1978 | Brears | 451/59 |
| 5,868,857 A | 2/1999 | Moinpour et al. | |
| 6,267,649 B1 | 7/2001 | Lai et | |
| 6,402,596 B1 * | 6/2002 | Hakomori et al. | 451/44 |
| 6,629,875 B2 * | 10/2003 | Steere, III | 451/9 |

FOREIGN PATENT DOCUMENTS

| | | |
|---|---|---|
| JP | A 1995-7-193030 | 7/1995 |
| JP | A 1996-8-1494 | 1/1996 |
| JP | 9-186234 | 7/1997 |
| JP | A 1999-11-625 | 1/1999 |
| JP | 5-329759 | 12/2001 |
| JP | 2001-345294 | 12/2001 |
| JP | 2002-25952 | 1/2002 |
| JP | 2002-208572 | 7/2002 |

OTHER PUBLICATIONS

Hiroyuki Yano et al., "Manufacturing Method of Semiconductor Device", U.S. Appl. No. 09/870,085, filed May 30, 2001.
Norio Kimura et al., "Polishing Apparatus and Method", U.S. Appl. No. 09/824,644, filed Apr. 4, 2001.
Wolf et al., Silicon Processing for the VLSI Eva, 1986, vol. 1, p. 532-42.
Notification for of the First Office Action and English translation thereof from PRC Patent Office.
Notification for Filing Opinion and English translation thereof from Korean Patent Office.
Notification of Reasons for Rejection issued by the Japanese Patent Office on Oct. 17, 2006, for Japanese Patent Application No. 2001-359818, and English-language translation thereof.
Notification of Reasons for Rejection issued by the Japanese Patent Office on Oct. 17, 2006, for Japanese Patent Application No. 2001-359818, and English-language translation thereof.

* cited by examiner

*Primary Examiner*—Jacob K. Ackun, Jr.
(74) *Attorney, Agent, or Firm*—Finnegan, Henderson, Farabow, Garrett & Dunner, L.L.P.

(57) ABSTRACT

In manufacturing a semiconductor device, a part of an element is formed on the surface of a substrate, and at least a periphery of the substrate is polished using a polishing member stretched around the periphery of the substrate so that a polishing face of the polishing member is slid on a polishing target surface of the periphery.

7 Claims, 11 Drawing Sheets

FIG. 2A
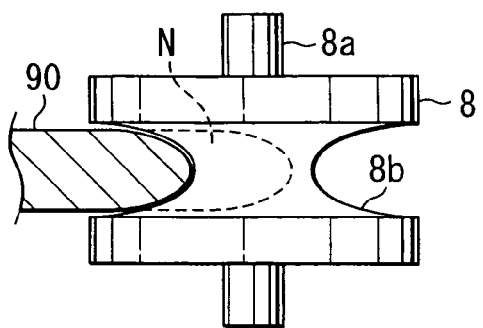
FIG. 2B
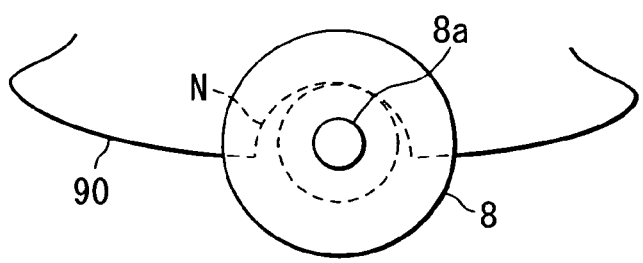
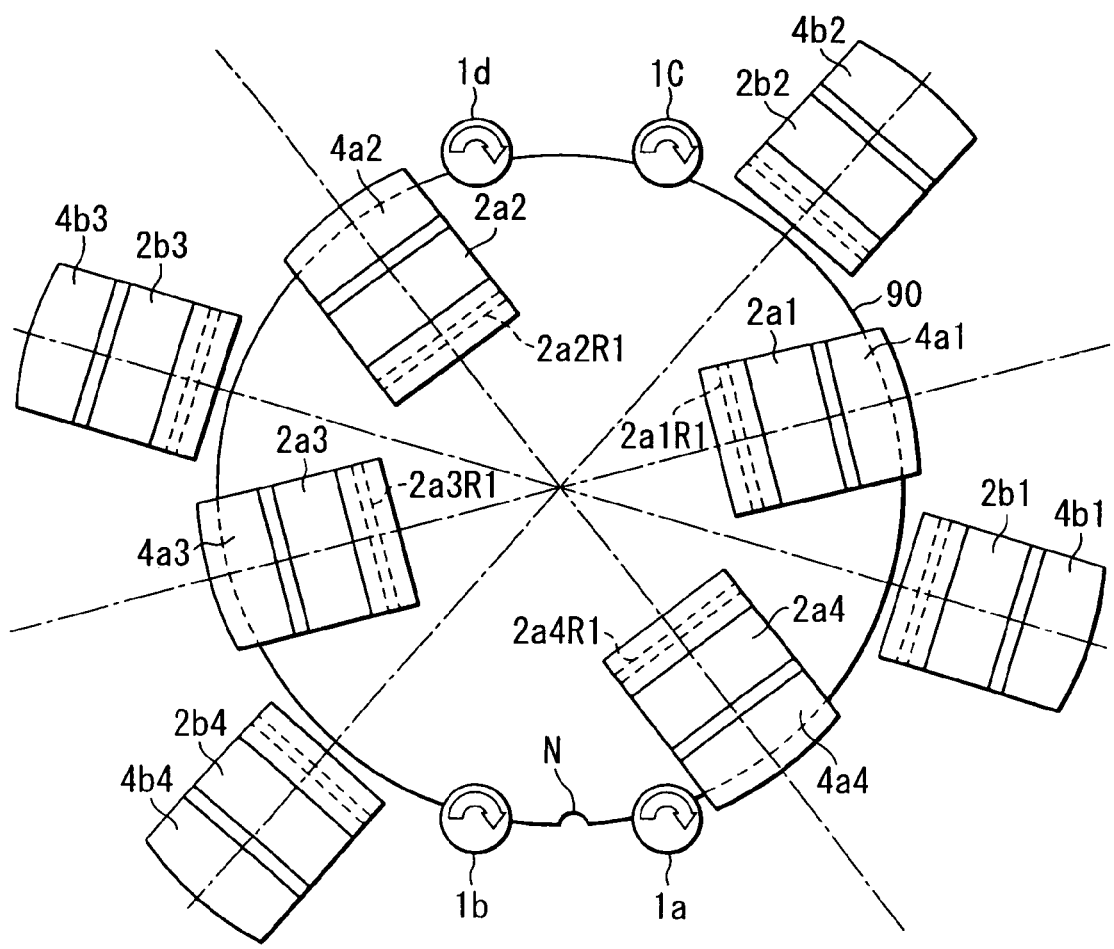
FIG. 3

METHOD FOR MANUFACTURING SEMICONDUCTOR DEVICE AND POLISHING APPARATUS

CROSS-REFERENCE TO RELATED APPLICATIONS

This application is a division of application Ser. No. 10/303,001, filed Nov. 25, 2002 now U.S. Pat. No. 6,933,234, which is based upon and claims the benefit of priority from the prior Japanese Patent Application No. 2001-359818, filed Nov. 26, 2001, the entire contents of each being incorporated herein by reference.

BACKGROUND OF THE INVENTION

1. Field of the Invention

The present invention relates to a method for manufacturing a semiconductor device and a polishing apparatus, and more particularly to a semiconductor device manufacturing method including a processing step of removing surface roughness of a substrate, the roughness being caused during manufacturing, or eliminating a deposit on the substrate and a polishing apparatus for embodying the processing.

2. Description of the Related Art

In recent years, trends toward finer pattern and higher density designing of semiconductor devices are advancing. In association with the trends, removing particles deposited on a substrate or removing an unnecessary film during manufacturing of semiconductor devices becomes increasingly important. For example, critical particles to be removed include dust generated due to surface roughness caused by working on the bevel and the edge of a wafer serving as a substrate during manufacturing of semiconductor devices.

In the present specification, for example, as shown in FIG. 17, a portion at the end of a principal surface of a wafer 90 where the edge line of the section of the wafer 90 cut along the center thereof is curved will be referred to as a bevel B. A substantially flat portion formed between the bevel B and the principal surface of the wafer 90 will be referred to as an edge E. The width of the edge E is several mm. A portion including these bevel B and edge E will be referred to as a periphery in the present specification.

The surface roughness caused by working is generated in RIE (Reactive Ion Etching) processing of forming, for example, trenches for a trench capacitor, particularly, deep trenches on the surface of the Si wafer 90.

The processing will now be described in brief hereinbelow. First, as shown in FIG. 17, a laminated film comprising a silicon nitride film 91 and an $SiO_2$ film 92 on the Si wafer 90 is patterned to form a hard mask HM.

Subsequently, as shown in FIG. 18, the Si wafer 90 is etched using the hard mask HM serving as a mask by an RIE method, thus forming the deep trenches 93. At this time, generally, acicular projections 94 are generated in an area corresponding to the bevel B and the edge portion E of the Si wafer 90. It is considered that a by-product generated in RIE is deposited on exposed surface of the bevel B and the edge E of the Si wafer 90, the by-product functions as a mask for etching, and the surface of the Si wafer 90 is etched.

Hitherto, under RIE processing conditions to accurately form the deep trenches 93 each having an aperture diameter of the order of submicrons and a high aspect ratio of tens, the acicular projections 94 are necessarily generated on the bevel B and the edge E.

The heights of the acicular projections 94 vary depending on locations. The maximum height thereof is substantially 10 μm. While the Si wafer 90 is transferred or processed in the manufacturing steps, the projections 94 are broken, thus generating particles mainly comprising Si. The particles result in a deterioration in yield. Therefore, it is necessary to immediately remove the acicular projections 94 during manufacturing.

Generally, the acicular projections 94 are removed by a CDE (Chemical Dry Etching) method. For example, as shown in FIG. 19, a resist 95 is applied to the principal surface of the Si wafer 90, namely, the whole device surface. After that, the resist 95 applied in an area corresponding to the bevel B and the edge E, the area having a width of several mm, is removed to expose the acicular projections 94.

The Si wafer 90 in the area which is not covered with the resist 95 is isotropically etched by the CDE method, thus removing the acicular projections 94 on the bevel B and the edge E. FIG. 20 shows the state of the surface at the bevel B and the edge E where the acicular projections 94 are removed. After that, as shown in FIG. 21, the resist 95 protecting the device surface is removed.

As mentioned above, the CDE method requires that the principal surface of the wafer 90, namely, the device surface on which the deep trenches 93 have been formed is protected by the resist 95 while the acicular projections 94 are being removed. Therefore, applying resist and removing resist, namely, two processing steps are needed. Since isotropic etching is performed, "aciculae" disappear but projections and depressions 96 corresponding to the variations in the heights of the first "aciculae" are remained (refer to FIGS. 20 and 21). Accordingly, it is very difficult to completely eliminate the surface roughness.

Dust generated by polishing is easily accumulated in this type of projections and depressions 96 during working such as CMP (Chemical Mechanical Polishing) which will be performed on and after the next processing. In some cases, the accumulated dust causes problems. Further, processing time per wafer necessary for the CDE method is generally long, for example, for five minutes or more. Disadvantageously, it results in a decrease in throughput and an increase in manufacturing cost.

In recent years, in the field of semiconductor devices, new materials such as Cu serving as a wiring material, Ru and Pt serving as capacitor electrode materials for a next-generation DRAM or FeRAM, and TaO and PZT serving as capacitor dielectric materials are introduced one after another. It is time to seriously consider about problems of contamination caused by these new materials in mass production.

Particularly, the important subject is to eliminate a film comprising such a new material which deposits on the bevel, the edge, and the rear surface of a wafer and serves as a contamination source during manufacturing of semiconductor devices. For example, when a Ru film to be used as a capacitor electrode is formed on a wafer, it is important to eliminate the Ru film deposited on the bevel, the edge, and the rear surface of the wafer.

A CVD (Chemical Vapor Deposition) method is generally used as a method for forming the Ru film. In this case, though the deposited amount of the Ru film is different depending on the configuration of the device, the Ru film is inevitably deposited on the bevel, the edge, and the rear surface of the wafer.

Even when an edge cut ring is used in a sputtering method, it is difficult to completely prevent the deposition of the Ru film on the bevel and the edge, the deposition being realized by spreading particles (Ru) generated by sputtering. Particularly, when the edge cut width is reduced without deteriorating the yield of chips formed on the periphery of the wafer, problems caused by the deposition of the Ru film become more serious.

Using any film forming method, the Ru film is deposited on the bevel, the edge, and the rear surface of the wafer after the Ru film is formed. Since this kind of Ru film deposited on the bevel and the other portions causes contamination in the subsequent processing, it is necessary to eliminate the unnecessary Ru film before the subsequent processing.

Conventionally, the Ru film deposited on the bevel and the other portions is eliminated by a wet etching method. In the wet etching method, generally, the rear surface of a Si wafer is set upward, the wafer is rotated horizontally, and chemicals are dropped on the rotating wafer. In order to properly spread chemicals on the bevel and the edge portion of the wafer, the number of revolutions of the wafer is controlled to prevent the chemicals from being spread to the device surface side over the bevel and edge portion.

However, in the case of the Ru film, the rate of elimination is about 10 nm/min, namely, it is low. Accordingly, elimination per wafer generally requires five minutes or more. That is, the elimination time is long, resulting in low throughput. Further, in addition to eliminating the Ru film put on the wafer, it is necessary to eliminate Ru diffused in the base wafer. In order to eliminate the diffused Ru, it is necessary to additionally perform wet etching using another chemicals which can etch the base wafer. Thus, the throughput is further deteriorated. In addition, there is no proper chemical which does not damage the device.

BRIEF SUMMARY OF THE INVENTION

According to one aspect of the present invention, there is provided a semiconductor device manufacturing method comprising: forming at least a part of an element on a surface of a substrate; and polishing at least a periphery of the substrate using a polishing member stretched around the periphery of the substrate so that a polishing face of the polishing member is slid on a polishing target surface of the periphery.

According to another aspect of the present invention, there is provided a polishing apparatus comprising: a polishing member having a polishing face which is in contact with at least a periphery of the substrate; and a stretching member for stretching the polishing member around the periphery of the substrate at an angle less than 90 degrees with respect to the surface of the substrate.

BRIEF DESCRIPTION OF THE SEVERAL VIEWS OF THE DRAWING

FIG. 2A is an enlarged side view showing a polishing wheel for polishing a notch of the Si wafer shown in FIG. 1A;

FIG. 2B is a diagram explaining the polishing of the notch of the Si wafer using the polishing wheel shown in FIG. 2A;

FIG. 3 is a schematic plan view showing a polishing apparatus used for coarse polishing and final polishing according to a second embodiment of the present invention;

DETAILED DESCRIPTION OF THE INVENTION

Embodiments of the present invention will now be described in detail hereinbelow with reference to the drawings.

When deep trenches serving as parts of a trench capacitor functioning as a component of, for example, a DRAM are formed on the surface of a Si wafer using the RIE method, surface roughness is caused on the bevel and the edge of the Si wafer. A first embodiment relates to a polishing method for eliminating the surface roughness.

Figure 17:
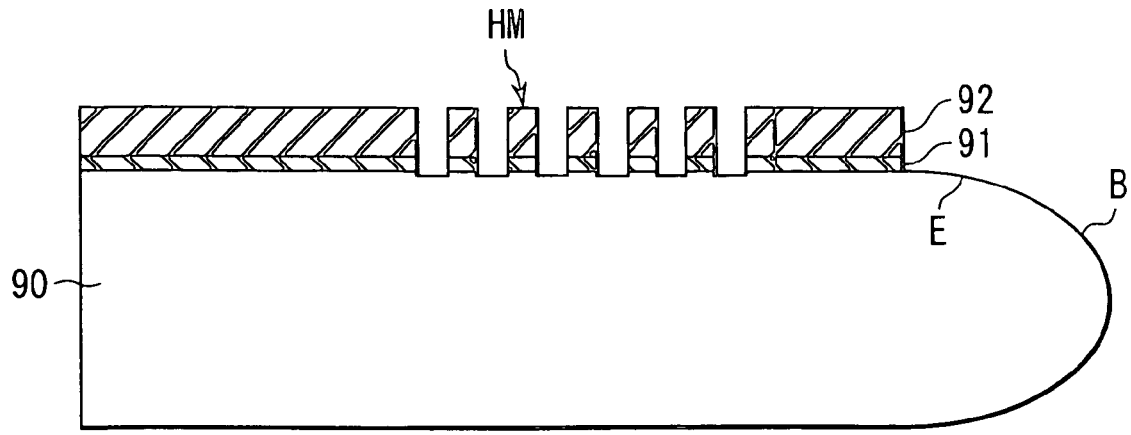
FIG. 17 is a sectional view showing the structure of a wafer subjected to a process of forming deep trenches of a trench capacitor according to the embodied semiconductor device manufacturing method of the present invention.
Figure 18:
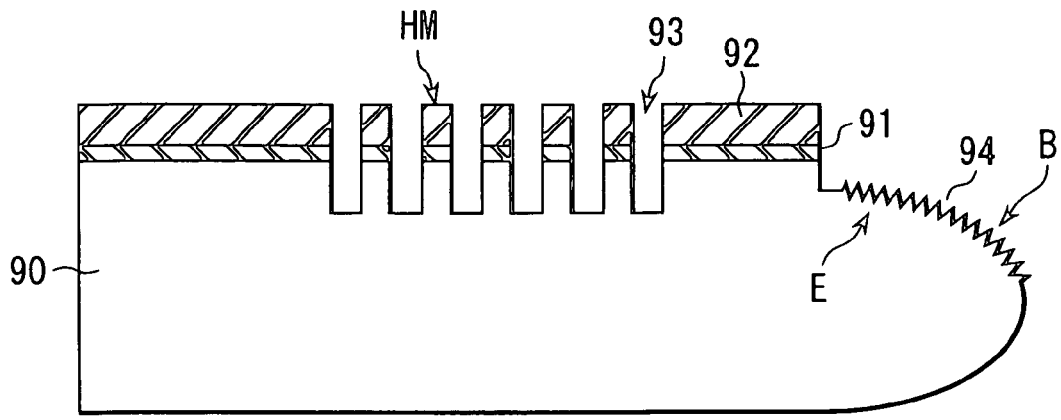
FIG. 18 is a sectional view showing the state of the surface of the wafer subjected to the above processing shown in FIG. 17.
Figure 19:
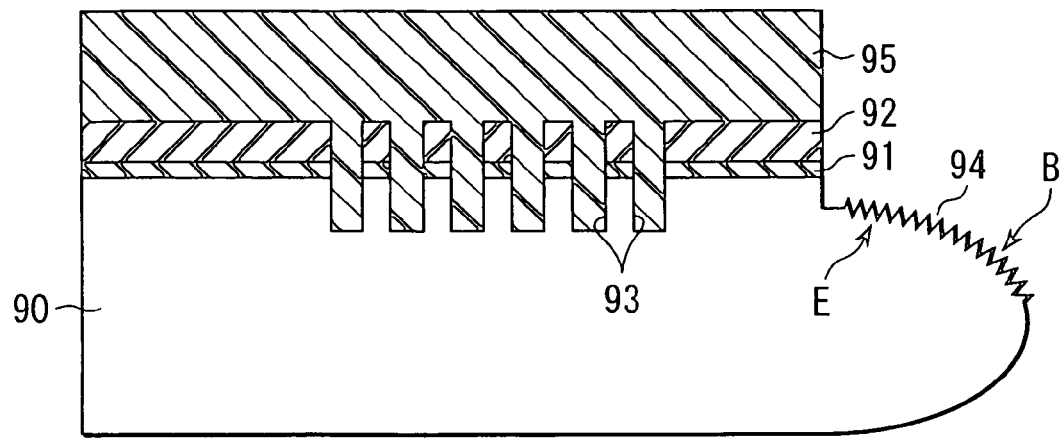
FIG. 19 is a sectional view showing an example of a conventional method for removing acicular projections generated in the processing of FIG. 18.

According to the present embodiment, a polishing object is the wafer 90 having the acicular projections 94 formed in the similar manner as in the processing shown in FIGS. 17 and 18. In order to avoid duplication, an explanation of the polishing object will be made with reference to FIGS. 17 and 18.

According to the first embodiment, the thickness of the silicon nitride film 91 used to form the hard mask HM on the principal surface of the wafer 90 shown in FIG. 17, namely, the device surface is set to 200 nm. The thickness of the $SiO_2$ film 92 is set to 900 nm. In FIG. 18, the diameter of an aperture of each deep trench 93 formed using the hard mask HM is set to 0.25 μm and the depth thereof is set to 7 μm.

When the deep trenches 93 are formed using the hard mask HM shown in FIG. 17 by the RIE processing, the acicular projections 94 are formed on the periphery of the Si wafer 90 including the bevel B and the edge E on the principal surface side of the wafer 90.

Figure 1A:
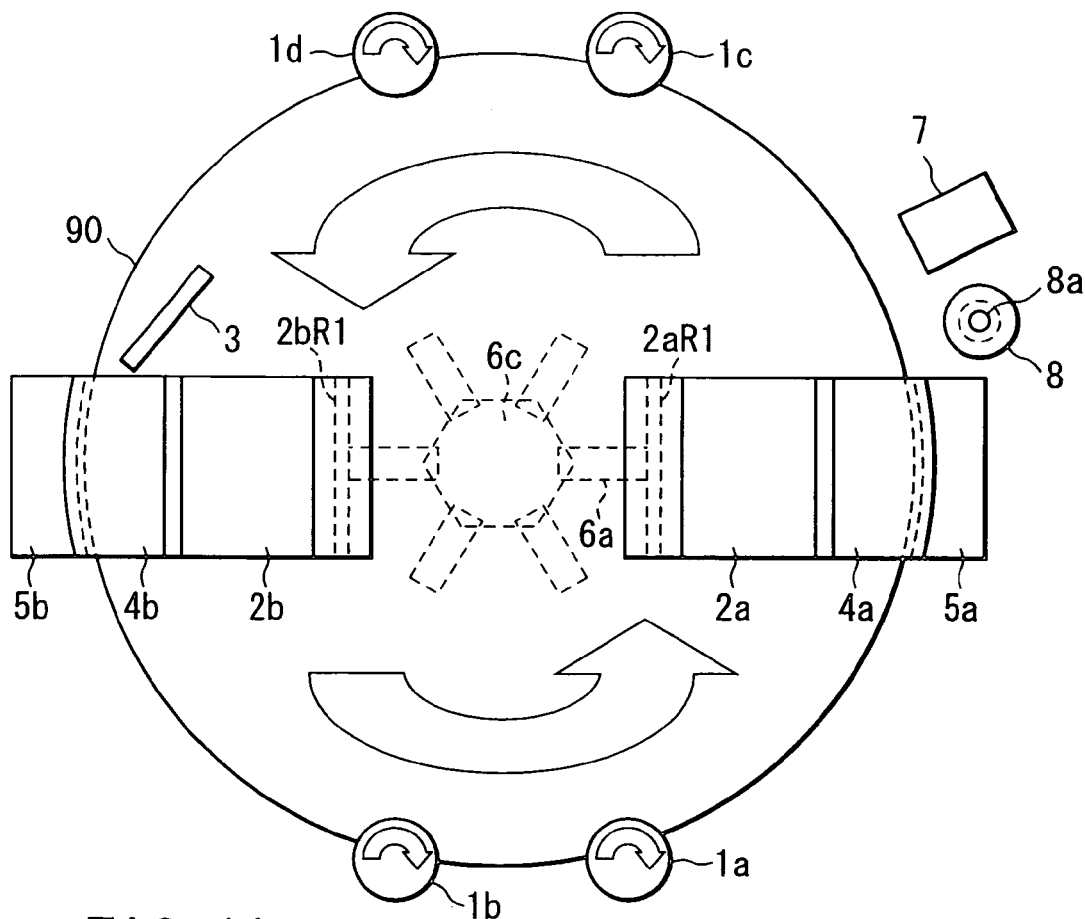
FIG. 1A is a schematic plan view of a state in which a Si wafer is set in a polishing apparatus according to a first embodiment of the present invention, the state being observed from above.
Figure 1B:
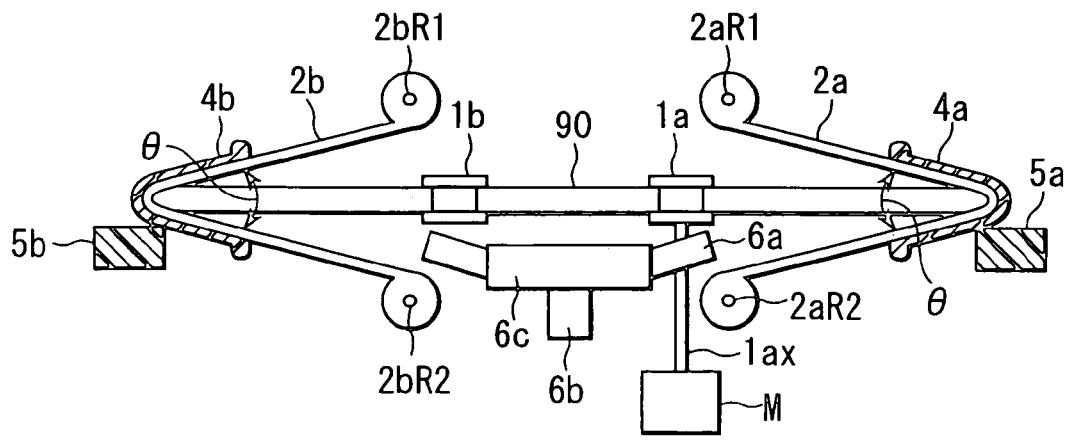
FIG. 1B is a schematic side view of the state in which the Si wafer is set in the polishing apparatus shown in FIG. 1A, the state being observed from one side.

Subsequently, the processing of removing the acicular projections 94 formed in the RIE processing shown in FIG. 18 is performed. According to the present embodiment, the acicular projections 94 are removed using a polishing apparatus shown in FIGS. 1A and 1B. FIG. 1A is a schematic plan view showing a state in which the Si wafer 90 is set in the polishing apparatus, the state being observed from above. FIG. 1B is a schematic side view of the state observed from one side.

Referring to FIGS. 1A and 1B, the Si wafer 90 is set so that the device surface, on which the deep trenches 93 are formed using the hard mask HM, faces downward in order to protect the device surface from particles generated in a space around the wafer 90 upon polishing. In this case, the wafer 90 is held by a plurality of holding rollers, namely, four rollers 1a, 1b, 1c, and 1d so that the wafer 90 can be rotated in a horizontal plane. The rollers 1a to 1d are rotatably held on shafts fixed to a predetermined frame (not shown).

A rotating shaft 1ax of the roller 1a is connected to a motor M and is rotated in the direction shown by the arrow in FIG. 1A. In this case, among the four rollers 1a to 1d, the roller 1a alone is driven by the motor M. Any one or several rollers of the other rollers 1b to 1d can also be driven by the same motor M or another motor.

Two tape-like abrasive members or films 2a and 2b are arranged on the periphery of the Si wafer 90 so that the polishing faces of the films are in contact with the Si wafer 90. Each of the two abrasive films 2a and 2b are bent toward the center of the wafer 90 at the top surface of the periphery of the Si wafer 90 along a line passing the center of the Si wafer 90. Each of the abrasive films 2a and 2b has a bonded abrasive type polishing face formed in such a manner that, for example, diamond having a grain size of #10000 is bonded on a PET film using a polyurethane type adhesive.

The abrasive film 2a is stored or rolled around a supply roller 2aR1 which is rotatably held on the frame (not shown) at one end. The supply roller 2aR1 is arranged above the Si wafer 90, namely, at a predetermined distance from the periphery close to the rear surface of the wafer 90. The other end of the abrasive film 2a is rolled around a take-up roller 2aR2 which is rotatably held on the frame (not shown). The take-up roller 2aR2 is located below the Si wafer 90, namely, at a predetermined distance from the periphery close to the principal surface of the Si wafer 90.

The take-up roller 2aR2 is rotated by, for example, a motor (not shown). Therefore, tension is given to the abrasive film 2a so that the film 2a is in contact with the periphery of the Si wafer 90. In the similar manner, tension is given to the abrasive film 2b.

The bent portions of the abrasive films 2a and 2b at the periphery of the wafer 90 have straight portions, since the films 2a and 2b are formed of an elastic material such as a PET film. Since the periphery of the wafer 90 is shaped as an arc of a circle, the inner surface of the bent portions of the films 2a and 2b do not contact with the surface of the periphery of the wafer 90 sufficiently. However, when the width of the films 2a and 2b are set to have a small size, for example, 30 mm, and when the diameter of the wafer 90 is 200 mm, it is possible to consider that the bent portions of the films 2a and 2b fully contact with the periphery of the wafer 90, in view of the softness of the PET film.

Further, if necessary, to the outer surfaces of the abrasive film 2a in a portion corresponding to the contact portions with the periphery of the Si wafer 90, both in the device and rear surfaces, an elastic cover 4a is attached. The elastic cover 4a is bent in a V-shaped form. The elastic cover 4a is previously shaped so that the angle θ is substantially the same angle at which the abrasive film 2a is stretched between the supply roller 2aR1 and the take-up roller 2aR2 via the periphery of the Si wafer 90. The other elastic cover 4b is shaped similarly. The elastic covers 4a and 4b have widths similar to those of the films 2a and 2b. The bent portions of the elastic covers 4a and 4b are shaped according to the shape of the top of the wafer periphery and the curved surface of the bevel B.

Therefore, when the elastic covers 4a and 4b are mounted to the outer bent portions of the stretched abrasive films 2a and 2b, the abrasive films 2a and 2b are forced to contact widely with the periphery of the wafer 90 by means of the elastic covers 4a and 4b.

Further, the elastic cover 4a is arranged so as to be pressed to the abrasive film 2a by a pressing plate 5a fixed to the frame (not shown). The pressing plate 5a is disposed below the periphery of the Si wafer 90. The pressing plate 5a is formed using an elastic solid material such as a rubber plate. The pressing plate 5a is disposed so that an end portion of the upper surface of the pressing plate 5a is pressed to the acicular projections 94 formed on the bevel B and the edge E of the Si wafer 90 shown in FIG. 18, with the elastic cover 4a and the polishing film 2a sandwiched between the pressing plate 5a and the projections 94.

As has been described above, in a portion which is symmetrical to the pressing plate 5a with respect to the center of the Si wafer 90, the similar abrasive film 2b is stretched between a supply roller 2bR1 and a take-up roller 2bR2 via the periphery of the Si wafer 90. An elastic cover 4b, which is bent in a V-shaped form, is disposed on the outer surface of the abrasive film 2b. The elastic cover 4b and the abrasive film 2b are pressed to the periphery of the Si wafer 90 by a pressing plate 5b.

Further, an abrasive liquid supply nozzle 3 for supplying chemicals or pure water serving as an abrasive liquid is disposed near a contact portion between the abrasive film 2b and the periphery of the Si wafer 90. The nozzle 3 is located above the Si wafer 90 on the upstream side of the rotation of the wafer 90. The abrasive liquid supplied to the upper surface (rear side) of the Si wafer 90 is spread in the acicular projections 94 being polished, which are formed on the lower side (device surface side) of the periphery of the Si wafer 90, due to capillarity in the contact portion and gravity. The abrasive liquid supply is adjusted to the extent that the polishing targets of projections 94 are just moisten. The abrasive liquid supply nozzle 3 is disposed on the only side of the abrasive film 2b, in this embodiment. The nozzle may be arranged on the side of the other abrasive film 2a.

A plurality of gas injection nozzles 6a are radially arranged below the Si wafer 90 at a position corresponding to the center thereof. Each gas injection nozzle 6a injects a cleaning gas such as air or nitrogen to blow particles generated upon polishing from the polishing targets. At least two nozzles are arranged so as to directly face the portions to be polished by the abrasive films 2a and 2b. The cleaning gas is introduced from a gas source (not shown) to a chamber 6c through a pipe 6b and is then supplied to the nozzles 6a at a uniform pressure.

A notch sensor 7 for detecting the position of a half-round depression formed on the periphery of the Si wafer 90, namely, a notch N (refer to FIGS. 2A, and 2B), and a diamond grinding wheel 8 for receiving an output signal of the notch sensor 7 and then polishing the inner side of the notch N are arranged near the periphery of the Si wafer 90 which is rotated.

The diamond grinding wheel 8 is pulley-shaped as shown in, for example, FIG. 2A. The diamond grinding wheel 8 has a polishing surface in a circular groove 8b having diamond powder coated thereon and having substantially the same cross section as that of the notch N formed on the periphery of the Si wafer 90. The diamond grinding wheel 8 is rotated around a rotating shaft 8a by a motor (not shown).

In FIG. 1A, the diamond grinding wheel 8 is disposed at a distance from the periphery of the Si wafer 90. After the acicular projections 94 are removed, the notch sensor 7 is driven to detect the notch N. When a detection signal is output from the sensor 7, the rotation of wafer 90 is stopped and the diamond grinding wheel 8 is moved to a position shown in FIG. 2B, by a moving mechanism (not shown). The notch N is polished while the Si wafer 90 is being suspended at the position.

A semiconductor device manufacturing method using the polishing apparatus shown in FIGS. 1A and 1B will now be described in detail hereinbelow. When the Si wafer 90 is set at the position shown in FIGS. 1A and 1B so that the device surface, on which the acicular projections 94 are formed as shown in FIG. 18, faces down, the motor M is driven to rotate the Si wafer 90 at, for example, a predetermined constant speed in the direction shown by the arrow via the roller 1a. At this time, the abrasive liquid supply nozzle 3 supplies the abrasive liquid of a predetermined amount and the injection nozzles 6a inject the cleaning gas to the periphery of the Si wafer 90 including the polishing targets. As mentioned above, the acicular projections 94 formed on the bevel B and the edge E of the Si wafer 90 are subjected to wet polishing by the rotation of the Si wafer 90. The present embodiment shows the case where the two abrasive films 2a and 2b are used. When many abrasive films are actually used as will be described later, enough polishing can be accomplished at higher speed.

While the Si wafer 90 is being rotated, the elastic covers 4a and 4b formed of elastic rubber, for example, press the stretched abrasive films 2a and 2b to both surfaces of the periphery of the wafer 90, respectively. Further, the pressing plates 5a and 5b press the elastic covers 4a and 4b to the rear surfaces of the abrasive films 2a and 2b, respectively. Consequently, the pressure is concentrated on the periphery of the Si wafer 90, particularly, the portion where the acicular projections 94 are formed. Thus, the acicular projections 94 can be efficiently polished by the abrasive films 2a and 2b. At this time, the abrasive film 2a is stretched between the supply roller 2aR1 and the take-up roller 2aR2, the abrasive film 2b is stretched between the supply roller 2bR1 and the take-up roller 2bR2, and each of the polishing faces of the abrasive films 2a and 2b is come into contact with the acicular projections 94 in a relatively large area due to the elasticity of the elastic covers 4a and 4b and the elasticity of the pressing plates 5a and 5b. Thus, unbalanced polishing is not performed.

As polishing proceeds, the polishing faces of the abrasive films 2a and 2b are clogged. Accordingly, the take-up rollers 2aR2 and 2bR2 are driven to take up the respective abrasive films 2a and 2b by a predetermined length so that respective new polishing faces are come into contact with the Si wafer 90.

As mentioned above, each of the polishing faces of the abrasive films 2a and 2b is come into contact with the acicular projections 94 in a relatively large area due to the elasticity of the elastic covers 4a and 4b and the elasticity of the pressing plates 5a and 5b. Consequently, the abrasive films 2a and 2b are substantially strectched via the periphery of the Si wafer 90 of the wafer 90 without giving large tension to the abrasive films 2a and 2b between the supply rollers 2aR1 and 2bR1 and the take-up rollers 2bR2 and 2bR2, respectively.

According to the present embodiment, the respective whole widths of the stretched abrasive films 2a and 2b can be come into contact with the periphery of the wafer 90, in addition to the aid by the elasticity of the elastic covers 4a and 4b.

When the elastic covers 4a and 4b are not used and when the width of the abrasive films 2a and 2b is large compared with respect to the diameter of the wafer 90, the middle portion alone of each of the abrasive films 2a and 2b may be come into contact with the Si wafer 90. For example, when the diameter of the Si wafer 90 is 200 mm, the length of the contact portion on the periphery with each of the abrasive films 2a and 2b is substantially 10 mm at most. The contact area cannot be increased, resulting in low polishing efficiency.

However, since the abrasive films 2a and 2b are stretched above and below the wafer 90, with a bent angle θ less than 90 degrees at the periphery of the wafer 90, the polishing surfaces of the abrasive films 2a and 2b can contact with wide areas of the periphery of the wafer 90 at which acicular projections 94 are formed.

Furthermore, the use of the elastic covers 4a and 4b can reduce variations in pressures applied on the contact surfaces of the abrasive films 2a and 2b with the wafer 90. Thus, variations in amounts of removed substance by polishing in the contact face can be sufficiently reduced. Such an advantage in that the variations in amount of removed substance by polishing in the contact face can be reduced is not obtained by merely pressing the pressing plates 5a and 5b to the abrasive films 2a and 2b, respectively. It is found that, when each of the pressing plates 5a and 5b is pressed to the corresponding abrasive films 2a and 2b with the elastic covers 4a and 4b therebetween, the polishing advantage can be obtained.

As mentioned above, the contact area between the Si wafer 90 and the abrasive films 2a and 2b which contribute to polishing is extended in order to increase the polishing rate and the variations in pressures applied to the contact faces are reduced to uniform the amount of removed substance by polishing. For this purpose, it is preferable that the elastic covers 4a and 4b formed so as to have a shape according to the outer shape of the periphery of the wafer 90 may be used.

According to the present embodiment, in order to polish the area having a width of several mm, the area including the bevel B and the edge E on the device surface of the Si wafer 90, the pressing plates 5a and 5b each formed of an elastic member are pressed vertically to the elastic covers 4a and 4b so that the abrasive films 2a and 2b are in contact with the edge E at, for example, about 1 kgf/cm$^2$. The strength of contact of each of the abrasive films 2a and 2b with a polishing target portion including the bevel and the edge E is adjusted by selecting the elasticity of each of the elastic covers 4a and 4b.

Further, the elastic covers 4a and 4b may be shaped so that each angle of bend is slightly smaller than the angle θ. When the elastic covers 4a and 4b are mounted on the abrasive films 2a and 2b, the abrasive films 2a and 2b will be fitted to the periphery of the Si wafer 90 so that the abrasive films 2a and 2b are sandwiched therebetween by the elastic force of the elastic covers 4a and 4b.

The area of the contact of the abrasive films 2a and 2b with the periphery of the Si wafer 90 can be varied by the respective angles θ, each of which is twice as much as the angle which the wafer 90 forms with the abrasive films 2a or 2b, shown in FIG. 1B. Accordingly, the angle θ is adjusted to match the shape of the periphery of each of various wafers having different specifications to obtain the optimum polishing result, as described in detail later. The abrasive films 2a and 2b are bent above and below the wafer 90 from the periphery to the device surface side of the wafer 90 by an angle less than 90 degrees.

Figure 15A:
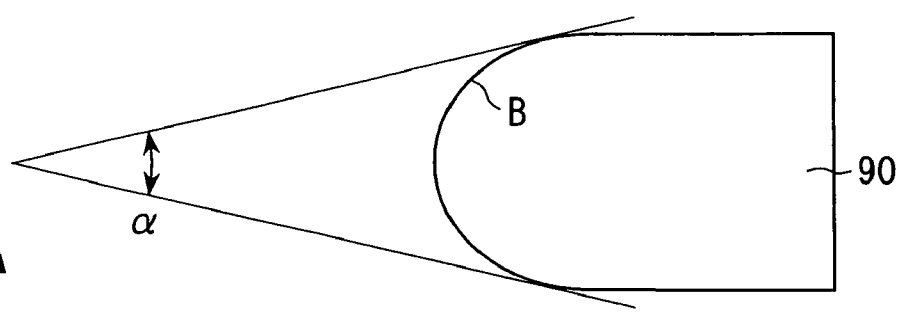
FIGS. 15A to 15D are diagrams showing the various shapes of the bevels of wafers being processed by the semiconductor device manufacturing method according to an embodiment of the present invention.
Figure 15B:
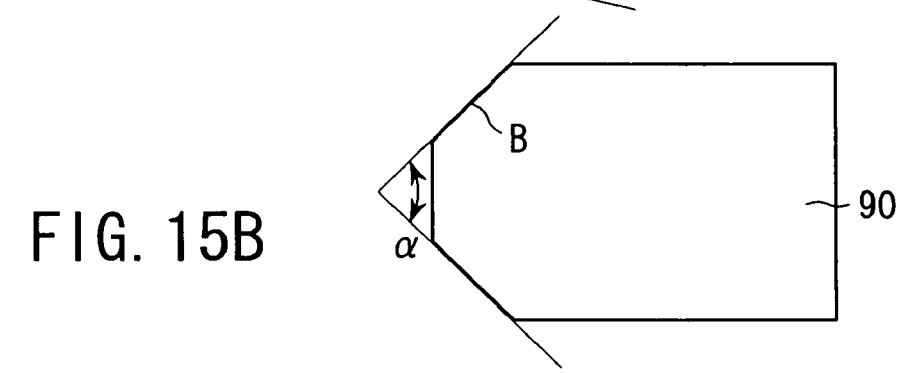
Figure 15C:
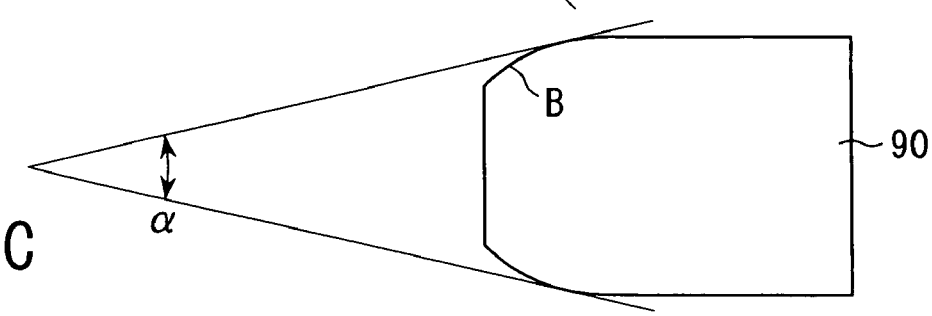
Figure 15D:
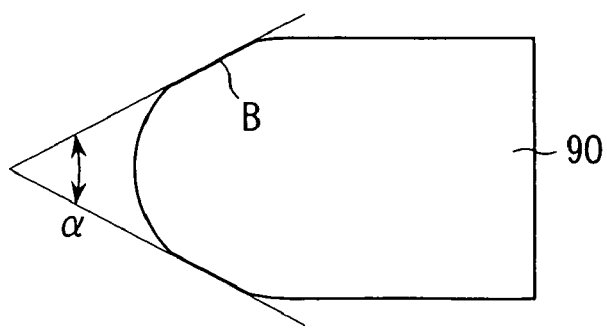

Typically, the peripheries of the wafers 90 have bevels B shaped as shown in FIGS. 15A to 15D. FIG. 15A shows a wafer 90 having a full-rounded type periphery including a rounded bevel B. The periphery has an arc-shaped contour. FIG. 15B shows a wafer 90 having an angular-type periphery including a plane bevel B and a plane end surface. The periphery has an angular-shaped contour. FIG. 15C shows a wafer 90 having a moderate-type periphery including a rounded bevel B and a plane end surface. FIG. 15D shows a wafer 90 having a moderate-type periphery including a wide planed bevel B and a rounded end surface.

The angle θ defined by the abrasive films 2a and 2b as shown in FIG. 1B should be set to be less than an angle α defined as shown in FIGS. 15A to 15D. In the cases of FIGS. 15A and 15C, the angle α is defined by two tangential lines drawn at a boundary point between the bevels B and both surfaces of the wafer 90. In the cases of FIGS. 15B and 15D, the angle α is defined by two bevel B planes as shown in these figures.

In FIG. 1B, the pressure P at each the contact areas between abrasive films 2a and 2b and Si wafer 90 is defined as:

$$P = T/\rho W,$$

where T is a tension of the elastic covers 4a and 4b, W is a width of the elastic covers 4a and 4b, and ρ is a curvature radius of the bevel B. Where, the thickness of the abrasive films 2a and 2b is assumed to be small with respect to the value of ρ. Therefore, it can be noted that the pressure at the contact area between the abrasive films 2a and 2b and the wafer 90 is even in the case of full-rounded type shown in FIG. 15A.

In the case of the angular type as shown in FIG. 15B having the plane bevel B, the curvature radius at the plane bevel B is very large, and the pressure applied to the bevel B of the wafer 90 from the abrasive films 2a and 2b becomes small. As a result, the pressure at the contact areas is not even. This problem will be occurred in the cases of FIGS. 15C and 15D.

In order to minimize the unevenness of the polishing pressure applied from the abrasive films 2a and 2b, a supporting jig having a rigid flat plane corresponding to the bevel B with a flat plane may be mounted on outer surface of the elastic covers 4a and 4b.

FIGS. 16A to 16F show various rigid members or jigs used in a further embodiment of the present invention.

Figure 16A:
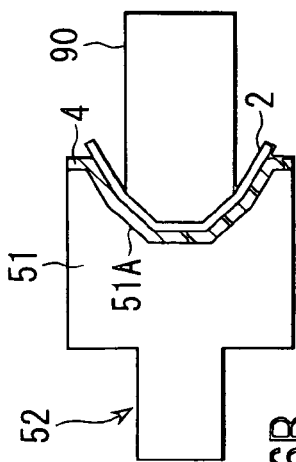
FIGS. 16A to 16F are side views showing the shapes of various jigs used in the semiconductor manufacturing method according to an embodiment of the present invention, the jigs being used to define the contact form of an abrasive film so as to correspond to any of the various forms of the bevels shown in FIGS. 15A to 15D.

FIG. 16A shows a jig 51 prepared to have a trapezoid-shaped groove 51A according to the shape of the bevel B of the wafer 90 as shown in FIG. 15B. An elastic cover or film 4 is attached to the groove 51A to prepare a polishing member 52 which is mounted to the polishing apparatus according to an embodiment of the present invention.

Figure 16B:
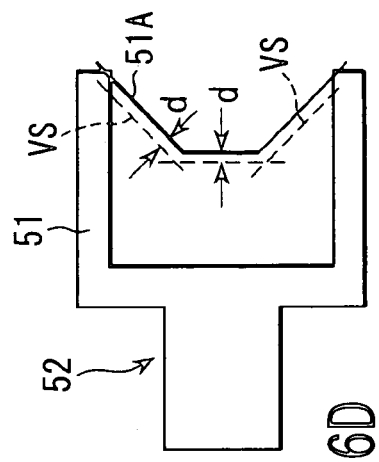

As shown in FIG. 16B, the polishing member 52 is abut on the periphery of the wafer 90 so that the elastic film 4 is deformed in the same shape as that of the groove 51A or the outer shape of the wafer periphery. As the elastic film 4 is deformed, stress is generated in the elastic film 4. When a abrasive film 2 is inserted between the elastic film 4 and the periphery of the wafer 90, the abrasive film 2 is evenly pressed on the flat surface bevel B of the wafer 90 by means of the stress generated in the elastic film 4.

A concrete method of determining a shape of an inner wall of the groove 51A of the jig 51 will be described later, so that desired stress can be applied to the polishing surface of the wafer 90 using the jig 51.

Figure 16C:
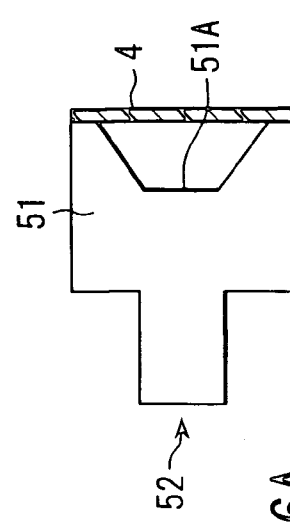

First, the elastic film 4 is bent until the bent angle becomes at a value corresponding to the inner shape of the groove 51A of the jig 51. At this time, the elastic film 4 is bent without contacting with the jig 51. Then, the bent elastic film 4 is attached to the jig 51 as shown in FIG. 16C, to determine the final shape of the elastic film 4 in accordance with a virtual inner surface VS of the groove 51A to be along with the broken lines extended from the flat plane of the bevel B shown in FIG. 15B.

Figure 16D:
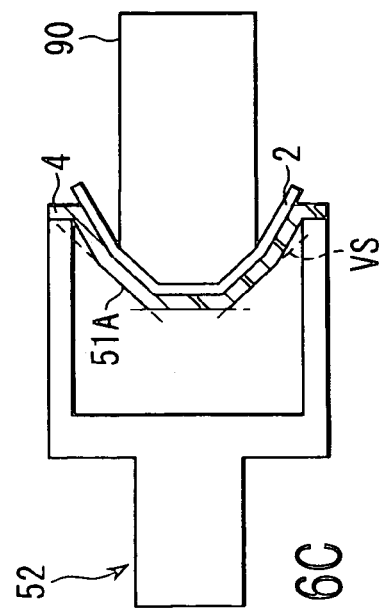

A plane shown by the solid lines as shown in FIG. 16D is a real inner surface of the groove 51A of the jig 51. This real inner surface is determined by shifting the virtual inner surface VS by a distance d in the direction normal to the surface VS as shown in FIG. 16D. The distance d is so determined as to satisfy the following equation:

$$pp = E \cdot (d/D),$$

where pp denotes a polishing pressure applied to the polishing area on the wafer 90, E a Young's modulus, and D a thickness of the elastic film 4.

Therefore, when the thickness D, Young's modulus E and the stress (polishing pressure) of the elastic film 4 are predetermined according to the elasticity of the material of the film 4, it is possible to obtain the distance d easily using the above equation.

Figure 16E:
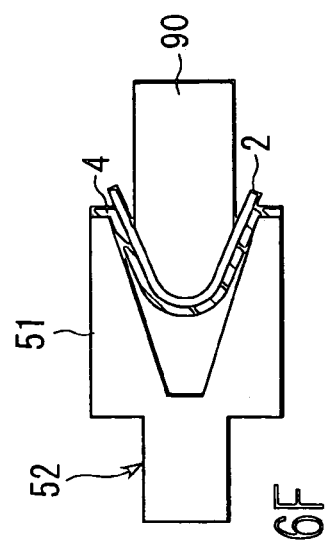
Figure 16F:
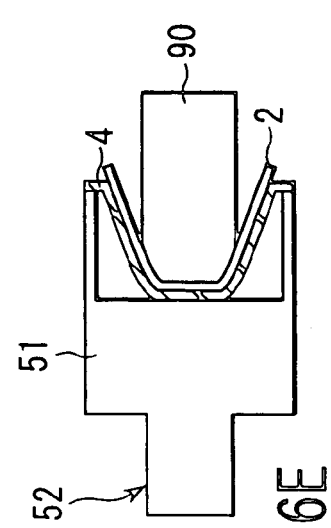

In the cases of FIGS. 15C and 15D having moderated shapes of bevels B, jigs 51 having flat grooves 51A parallel to the flat surfaces of the bevels B may be used to press the elastic film 4 toward the periphery of the wafer 90 as shown in FIGS. 16E and 16F.

As has been described above, the strength of the pressure applied from the abrasive film 2 to the bevel B can be adjusted by the deformation stress T of the elastic film 4 in the full-rounded type of FIG. 15A. In the cases of angular-type and moderated type as shown in FIGS. 15B, 15C and 15D, the polishing pressure can be adjusted by the stress T and the distance d.

In addition to the polishing of the bevel B, the polishing pressure at the edge E can be adjusted by adjusting the pressing force applied by the pressing plates 5a and 5b shown in FIG. 1B. Namely, as shown in FIG. 1B, the pressing plates 5a and 5b are pressed upwardly in the vertical direction so that the abrasive films 2a and 2b are pressed to the area of the edge E in the range of a width of several mm with a pressure of about 98066.5 Pa (=1 kgf/cm$^2$).

Preferably, the cleaning gas to be blew from the gas injection radial nozzles 6a to the device surface on the wafer 90 is incident on the device surface at a small angle so as to blow from the center of the device surface to the periphery at a flow rate of 5 m/sec or more. Further, the gas injection radial nozzles 6a are disposed near both the device surface and the rear surface of the Si wafer 90, it is more effective.

Figure 4:
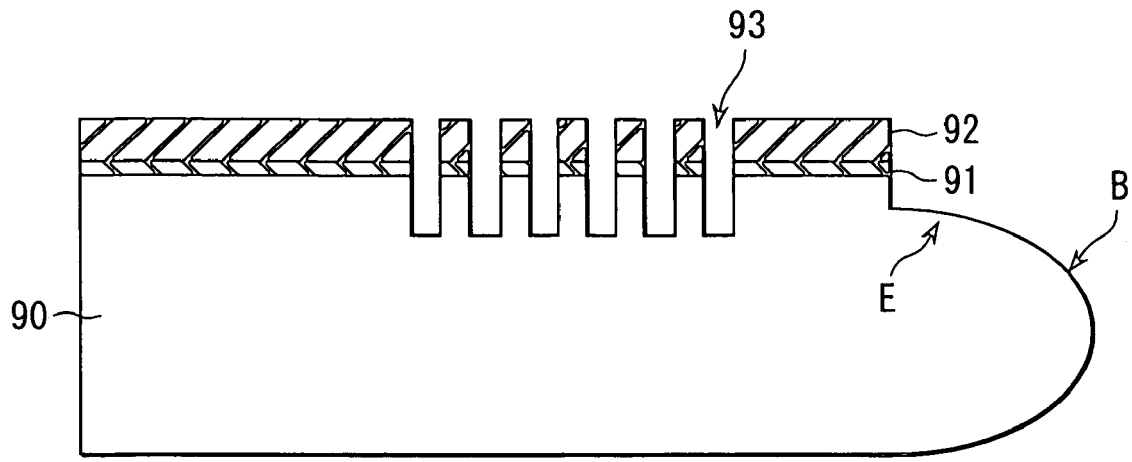
FIG. 4 is a sectional view showing a state of the surface on the bevel and the edge of a wafer polished by the polishing apparatus according to the embodiments of the present invention.

FIG. 4 shows a state in which the acicular projections 94 formed on the Si wafer 90 shown in FIG. 18 are removed by polishing. As will be obviously understood from FIG. 4, the acicular projections 94 are completely removed and the flat polished face having no depression and no projection is formed on the bevel B and the edge E of the wafer 90.

The acicular projections 94 formed on the periphery of the Si wafer 90 can be removed by the polishing apparatus shown in FIGS. 1A and 1B. However, the roughness or the acicular projections on the inner side of the notch N having the shape shown in FIG. 2B caused by etching, cannot be eliminated. The notch N can be polished by the diamond grinding wheel 8 shown in FIG. 2A.

First, the position of the notch N formed in the periphery of the Si wafer 90 is detected by the notch sensor 7 shown in FIG. 1A. When the notch N is detected, the motor M is stopped to stop the wafer 90. At this time, the positional relation between the notch sensor 7 and the Si wafer 90 is previously adjusted so that when the notch N is stopped in front of the diamond grinding wheel 8, the motor M is stopped to suspend the Si wafer 90. After that, the diamond grinding wheel 8 is moved to the position shown in FIG. 2B by the moving mechanism (not shown) and is then fitted to the notch N. The diamond grinding wheel 8 has the polishing groove 8b which is fitted to the notch N. For a standard of a grindstone, for example, when diamond having a grain size of, e.g., #10000 is used, the polished face is extremely smoothed.

FIG. 2B is the plan view of the state in which the diamond grinding wheel 8 is fitted to the notch N, the state being observed from above. Upon actual polishing, the bottom of the polishing groove 8b on the side of the diamond grinding wheel 8 is fitted to the bevel of the notch N and the diamond grinding wheel 8 is moved laterally and longitudinally by moving the rotating shaft 8a to polish the whole inner surface of the notch N corresponding to the bevel B and the edge E.

In the description regarding the polishing apparatus shown in FIGS. 1A and 1B, each of the abrasive films 2a and 2b for polishing the periphery of the Si wafer 90 has a moderately fine grain size so as to realize target final roughness. The abrasive films 2a and 2b are used without being replaced by other films until the polishing is completed. However, actually, the number of abrasive films which are used simultaneously is increased to reduce polishing time. Further, the following method may be used: Abrasive films each having a polishing face of a coarse grain size are first used. Then, the films are replaced by abrasive films each having a polishing face of a finer grain size for finishing.

FIG. 3 shows a polishing apparatus according to a second embodiment of the present invention. The polishing apparatus uses the above structure. Referring to FIG. 3, in the polishing apparatus, four abrasive films 2a1, 2a2, 2a3, and 2a4 each having a polishing face of a coarse grain size are first in contact with the periphery of the Si wafer 90 to polish the wafer 90. In a manner similar to the first embodiment shown in FIGS. 1A and 1B, elastic covers 4a1 to 4a4 are combined with the abrasive films 2a1 to 2a4, respectively. The elastic covers 4a1 to 4a4 give predetermined pressures to the abrasive films 2a1 to 2a4, respectively.

Abrasive films 2b1, 2b2, 2b3, and 2b4 each having a fine grain size for finishing are combined with elastic covers 4b1 to 4b4, respectively. They are disposed so as not to be in contact with the Si wafer 90, when the abrasive films 2a1 to 2a4 of coarse grain size are used.

In this state, the holding roller 1a is driven in the direction shown by the arrow in FIG. 3 by a motor in the same way as in the state shown in FIG. 1B, thus rotating the Si wafer 90 counterclockwise direction. The periphery of the Si wafer 90 is polished coarsely by the abrasive films 2a1 to 2a4. At this time, in the same way as in the first embodiment shown in FIGS. 1A and 1B, an abrasive liquid may be supplied from an abrasive supply nozzle (not shown) to polishing target portions to perform wet polishing. Further, nozzles (not shown) similar to the nozzles 6a shown in FIGS. 1A and 1B can be disposed near the device surface to blow dust generated due to polishing using a cleaning gas.

For example, under the following conditions the acicular projections 94 formed on the bevel B and the edge E of the wafer 90 in FIG. 18 were removed using the polishing apparatus shown in FIG. 3.

First abrasive films (2a1 to 2a4): each film was formed in such a manner that diamond having a grain size of #4000 was bonded on a PET film using a polyurethane type adhesive (for coarse polishing).

Second abrasive films (2b1 to 2b4): each film was formed in such a manner that diamond having a grain size of #10000 was bonded on a PET film using a polyurethane type adhesive (for finishing).

Each of the first and second abrasive films had a width of 3 cm. As shown in FIG. 3, around the wafer 90 of 300 mm diameter, the first films (2a1 to 2a4) were disposed at four positions and the second films (2b1 to 2b4) were disposed at four positions.

Contact force: pressure applied from each of the elastic covers (4a1 to 4a4, 4b1 to 4b4) to each of the first abrasive films (2a1 to 2a4) and the second abrasive films (2b1 to 2b4) was set to 1 kgf.

Angle $\theta$: each of angles $\theta$ was set to 30 degrees.

Number of revolution of the Si wafer 90: 100 rpm.

Abrasive liquid to be supplied from the nozzles (not shown) corresponding to the nozzle 3: pure water (four nozzles (not shown) were mounted near the abrasive films 2a1 to 2a4 and pure water per nozzle was supplied at 10 ml/min).

First, as shown in FIG. 3, the abrasive films 2a1 to 2a4 for coarse polishing were come into contact with the wafer 90 at four positions and polishing was performed for one minute. The acicular projections were removed by the polishing (coarse polishing).

Subsequently, the abrasive films 2a1 to 2a4 for coarse polishing were replaced by the abrasive films 2b1 to 2b4 for finishing. Then, finish polishing was performed for one minute. The polishing (final polishing) completely removed a damage of the coarse polishing remained on the surface of the periphery of the Si wafer 90. The surface on the bevel B and the edge E became a mirror like surface having average roughness Ra of 3 nm or less.

Subsequently, the notch N of the wafer 90 was polished using a diamond grinding wheel similar to that 80 shown in FIG. 1A. The diamond grinding wheel was rotated at 1000 rpm and polishing was performed for 30 seconds. Thus, the acicular projections in the notch N were completely removed.

After that, in another processing unit, the Si wafer 90 (mainly, the bevel B and the edge E) was washed using pure water or an aqueous surface-active agent solution while being rubbed with a PVA spongy and was then rinsed and dried. Thus, the process for polishing the acicular projections on the bevel B and the edge E was completed.

As mentioned above, bonded abrasive type films were used serving as the abrasive films 2a1 to 2a4 and 2b1 to 2b4. The bonded abrasive type film is formed in such a manner that diamond powder is bonded on a flexible tape backing, for example, a PET film using a polyurethane type adhesive. Consequently, it is unnecessary to protect the device surface using a resist, the protection being required for the conventional CDE method. As a result, applying a resist for protection and removing the resist after the removal of the acicular projections, namely, two processing steps can be omitted.

Figure 20:
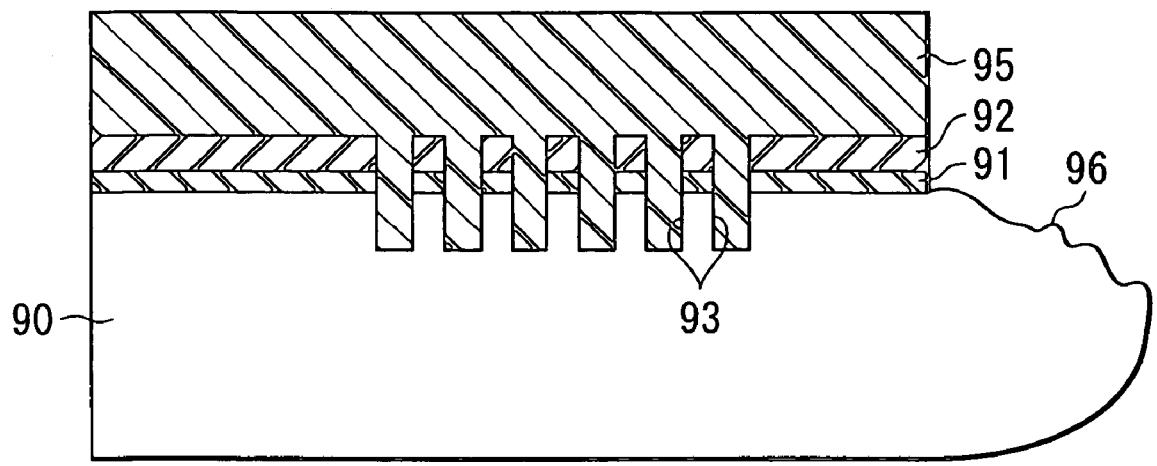
FIG. 20 is a sectional view showing the wafer subjected to the conventional method for removing acicular projections shown in FIG. 19.
Figure 21:
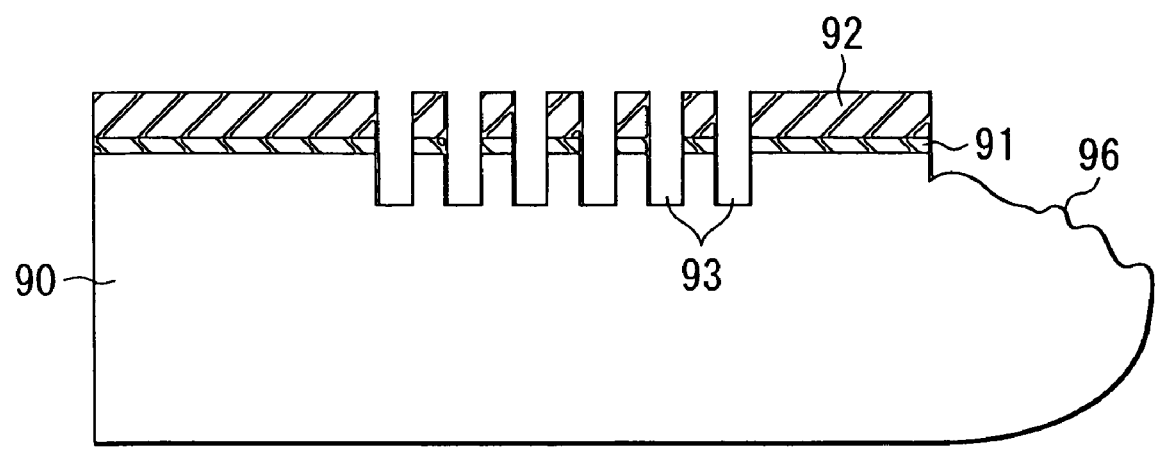
FIG. 21 is a sectional view showing the wafer subjected to the method shown in FIG. 20, namely, showing the shape of the end of the wafer in which the acicular projections are removed.

According to the polishing method using the polishing apparatus of the first and second embodiments of the present invention, the polished surface on the bevel B and the edge E after the acicular projections 94 were completely removed as shown in FIG. 4 to have a smooth surface. Thus, it is possible to overcome the conventional disadvantage in that upon working such as CMP which is performed on and after the next processing, dust is accumulated in the depressions and projections 96 which are remained after the removal of the acicular projections and correspond to the variations in the heights of the original "aciculae", as shown in FIGS. 20 and 21.

A washing unit having the nozzles 6a for injecting a cleaning gas as shown in FIGS. 1A and 1B is also provided for the polishing apparatus according to the second embodiment. When the acicular projections 94 are removed using this polishing apparatus including the washing unit, processing time per wafer can be set to about three minutes as mentioned above. Therefore, the processing time can be shorter than processing time of more than five minutes in the conventional CDE method, thus increasing the throughput.

Figure 5:
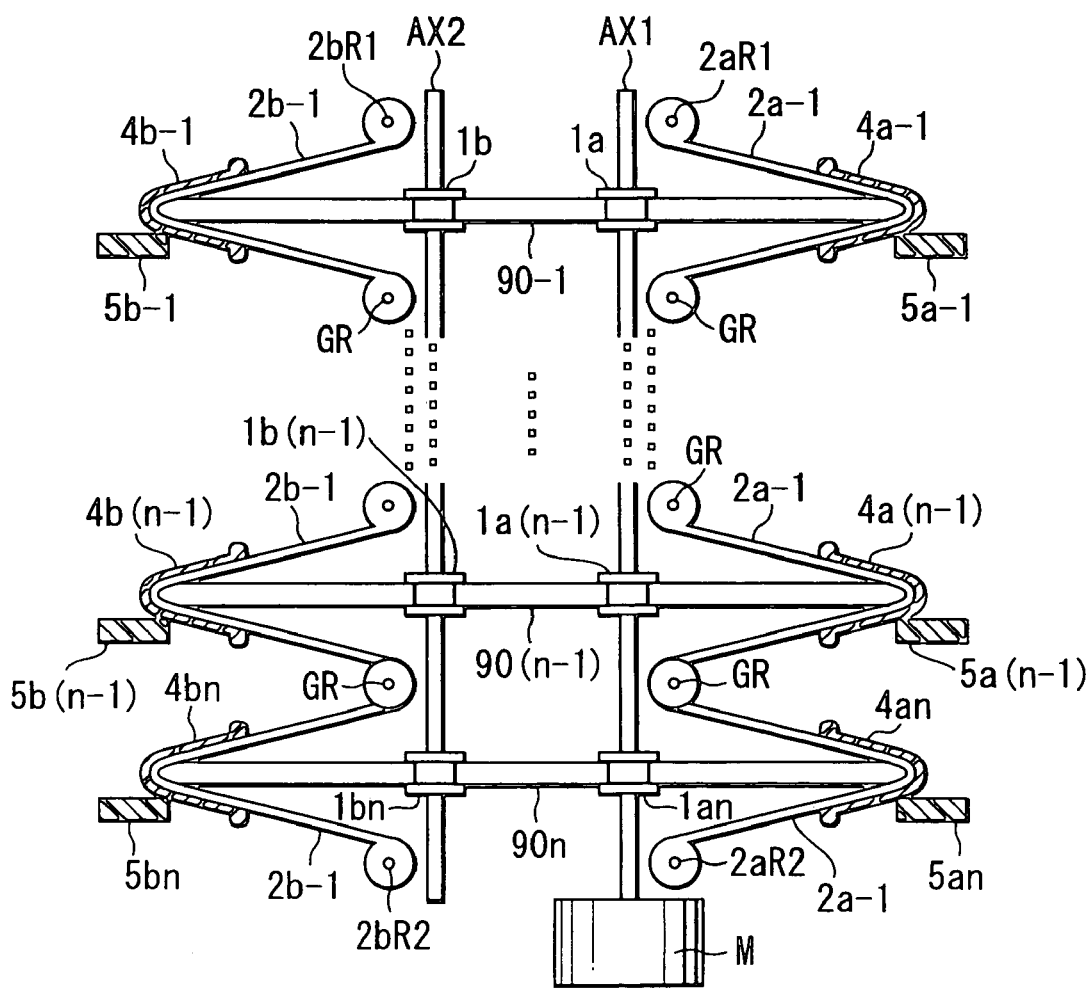
FIG. 5 is a side view showing the schematic configuration of a modification of the polishing apparatus according to the first embodiment.

Further, according to a further embodiment of the polishing apparatus of the present invention, the polishing apparatus shown in FIGS. 1A and 1B is used as one unit and a polishing apparatus having plural (n) units can be constructed. For example, as shown in FIG. 5, long rotating shafts AX1 and AX2 are used serving as rotating shafts of the holding rollers. The holding rollers 1a and 1b are fixed to the rotating shafts AX1 and AX2 to hold a first wafer 90-1. n holding rollers 1a, 1b, . . . , 1a(n−1), 1b(n−1), 1an, and 1bn are used to hold the wafer 90-1, the (n−1)th wafer 90(n−1) and the nth wafer 90n, respectively.

For example, when the motor M is connected to one end of the rotating shaft 1AX, the wafers 90-1 to 90n set in all of the units can be simultaneously rotated by driving the motor M. Thus, the throughput can be further increased.

In the polishing apparatus in FIG. 5, further, a plurality of abrasive films, two abrasive films 2a-1 and 2b-1 in this case, can be shared in all of the n units. In other words, the supply rollers 2aR1 and 2bR1 are disposed in the uppermost unit and the take-up rollers 2aR2 and 2bR2 are arranged in the lowermost unit. The long abrasive films 2a-1 and 2b-1 are stretched therebetween. Consequently, the abrasive films are guided to the units between the uppermost and lowermost units so that tension is given by guide rollers GR.

In the embodiment of FIG. 5, the wafer 90-1 is polished by the abrasive films 2a-1 and 2b-1, elastic covers 4a-1 and 4b-1, and pressing plates 5a-1 and 5b-1. Similarly, the wafer 90(n−1) is polished by the abrasive films 2a-1 and 2b-1, elastic covers 4a(n−1) and 4b(n−1), and pressing plates 5a(n−1) and 5b(n−1). The wafer 90n is polished by the abrasive films 2a-1 and 2b-1, elastic covers 4an and 4bn, and pressing plates 5an and 5bn.

Further, since each of the above-mentioned polishing apparatuses has a simple configuration, the price of the apparatus is lowered. Since pure water and a small amount of chemicals are used serving as raw materials, the running cost can be remarkably reduced. As mentioned above, according to the foregoing embodiments, there are big advantages in that the cost can be reduced.

An in-situ type monitor mechanism for monitoring a polishing state during polishing and feeding back the result into the polishing operation can be mounted on each of the polishing apparatuses of the foregoing embodiments of the present invention.

A well-known mechanism (not shown) using an optical method can be used serving as the monitor mechanism. The mechanism includes a light source for irradiating light to the acicular projections 94 on the wafer 90 as shown in, for example, FIG. 18, a photodetector for detecting scattered light, and a determination unit for determining the final point of polishing on the basis of the detection result.

In the early stages of polishing, the bevel B and the edge E are rough. Accordingly, the light irradiated on the wafer 90 is irregularly reflected. Therefore, the intensity of reflection is low. However, as polishing proceeds, the reflection on the polished surface shifts to mirror reflection, thus increasing the intensity of reflection. The determination unit compares the intensity (intensity of reflection) of the light detected by the photodetector with a predetermined level (threshold value). When the intensity of reflection is equal to or larger than the threshold value, the determination unit determines this point serving as the final point of polishing.

The configuration of each of the embodied polishing apparatuses can be modified within the spirit and scope of the appended claims of the present invention without departing from the essence thereof. Particularly, various methods for allowing the abrasive films to come into contact with the periphery of a wafer can be considered in accordance with the periphery configuration the wafer.

Figure 6A:
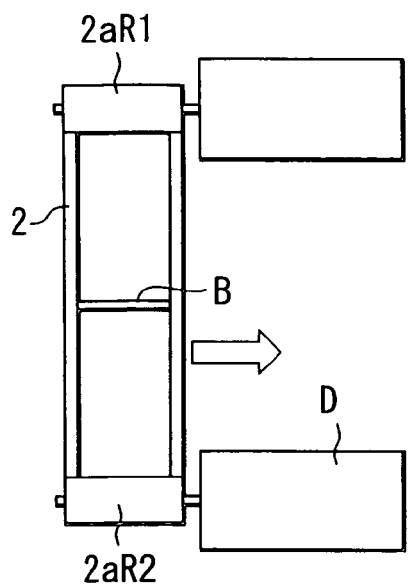
FIGS. 6A, 6B, and 6C are diagrams of three examples each showing relative arrangement between abrasive films and a wafer, the diagrams showing three arrangements according to another embodiments of the present invention.

According to the described embodiments, as shown in FIG. 6A, an abrasive film 2 is arranged between the supply roller 2aR1 and the take-up roller 2aR2 so that the longitudinal direction of the film 2 is perpendicular to the bevel B of the wafer. In this arrangement, the abrasive film 2 may be dragged in the wafer rotating direction, shown by the arrow in FIG. 6A, and be then twisted. Since the rotating shaft of the take-up roller 2aR2 for the abrasive film 2 is perpendicular to the wafer rotating shaft, it is difficult to allow for compact arrangement of a driving unit D for taking up the abrasive film 2 in a wafer rotating unit.

Figure 6B:
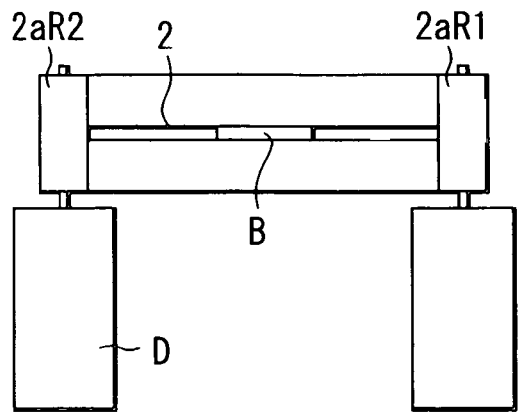

To overcome the above disadvantages, there is a method for arranging the abrasive film 2 so that the longitudinal direction thereof is in parallel to the surface of the bevel B of the wafer (FIG. 6B). However, in this arrangement, the effective area of the abrasive film 2 is remarkably reduced. When an expensive abrasive film is used, it is not economical.

Figure 6C:
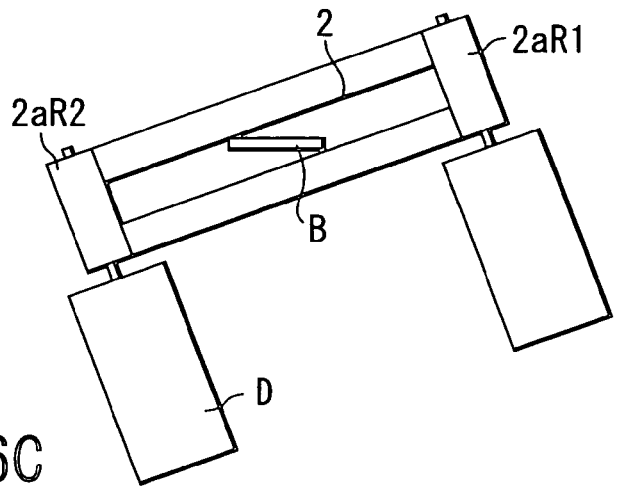

According to a further embodiment of the present invention, a method for obliquely applying the abrasive film 2 to the periphery surface of a bevel B as shown in FIG. 6C is considered. In this manner, the abrasive film 2 is hardly twisted and the effective area can be increased.

Figure 7:
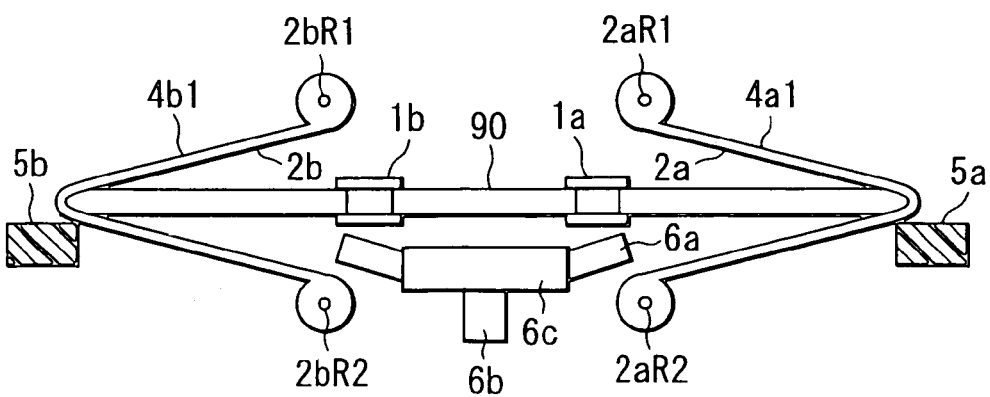
FIG. 7 is a diagram showing a method for polishing the bevel and the edge of a wafer utilizing an elongated elastic member having an abrasive surface in a polishing apparatus according to a further embodiment of the present invention.

According to a still further embodiment of the present invention, another method for applying loads to the abrasive film 2 which is in contact with the bevel B and the edge E using a member having elasticity can be considered. For example, as shown in FIG. 7, stretched elastic covers 4a1 and 4b1 are superimposed on the abrasive films 2a and 2b. Both the superimposed or bonded films 2a, 4a and 2b, 4b are simultaneously taken up on the take-up roller 2aR2 and 2bR2, respectively. Alternatively, the abrasive film 2a, 2b can also be made of an elastic member such as elastic rubber. In this case, the elastic covers may not be used.

Figure 8:
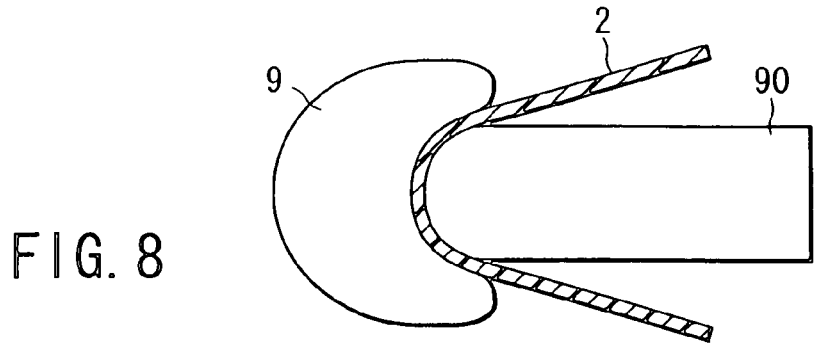
FIG. 8 is a diagram showing another method for pressing an abrasive film to the bevel and the edge of a wafer using an elastic member to polish the bevel and the edge in a polishing apparatus according to a still further embodiment of the present invention.

According to a further embodiment of the present invention, as shown in FIG. 8, a cushion 9 having elasticity can be applied to the abrasive film 2 instead of using the elastic cover such as the elastic cover 4a shown in FIG. 1B. The cushion 9 is formed in such a manner that a bag formed of a thin elastic film is filled with a gas such as air or a liquid such as water and is then sealed. On the basis of Pascal's principle, an advantage in that a uniform pressure is applied to the bevel plane of the wafer 90 can be expected, irrespective of the shape of the bevel B.

Figure 9:
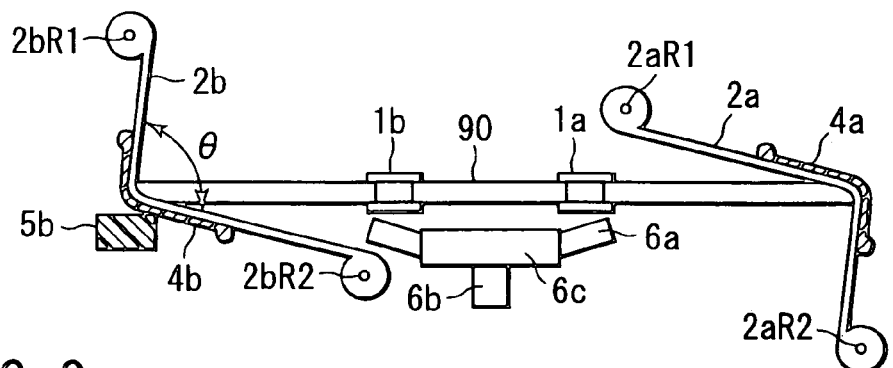
FIG. 9 is a diagram showing the arrangement to permit different abrasive films to come into contact with the principal surface and the rear surface, respectively, at the periphery of a Si wafer in a polishing apparatus according to a further embodiment of the present invention.

In the foregoing embodiments, one abrasive film 2 is in contact with the bevel plane on the device surface and that on the rear surface of the wafer. According to a still further embodiment of the present invention, as shown in FIG. 9, one abrasive film can be in contact with the bevel of one surface and the other abrasive film can be in contact with the bevel of the other surface. According to the present arrangement, each abrasive film can be surely fitted to the curvature of the bevel plane.

As shown in FIG. 9, the position of the take-up roller 2aR2 of the abrasive film 2a is moved to a position as shown in FIG. 9 from the position shown in FIG. 1B, so that the angle between the abrasive film 2a in the side of the take-up roller 2aR2 and the rear surface of the wafer 90 is about 90 degrees.

On the side of the abrasive film 2b, the supply roller 2bR1 is moved to a position as shown in FIG. 9 so that the angle between the abrasive film 2b in the side of the supply roller 2bR1 and the device surface of the wafer 90 is about 90 degrees. The elastic covers 4a and 4b are also shaped in accordance with the modified angle of the abrasive films 2a and 2b. In this case, only the elastic cover 4b is arranged to be pushed up by the pressing plate 5b.

By the described arrangement, the acicular projections generated at the bevel of the device surface side of the wafer 90 are effectively removed by the arrangement of abrasive film 2b, elastic cover 4b and elastic pressing plate 5b. At the same time, the bevel of the rear side of the wafer 90 is also polished effectively by the abrasive film 2a and elastic cover 4a.

Furthermore, in the arrangement in which at least two abrasive films are in contact with the bevel planes of both surfaces of the wafer 90, the angle θ of bend of the abrasive films 2a, 2b and that of the elastic covers 4a, 4b are more than 90 degrees. In other words, the bent angle of these members from a straight condition is small. Accordingly, a thick abrasive film and a thick elastic cover that is hard to bend can also be used. For example, a thin-film grindstone can be used serving as the abrasive film.

According to the foregoing embodiments, the wafer 90 is rotated using the holding rollers 1a to 1d while being held by the rollers. Alternatively, the rear surface of the wafer can be held using a vacuum adsorption chuck and the wafer can be rotated by the vacuum adsorption chuck.

Processing conditions for polishing can be appropriately changed. The shape of an abrasive film and the kind of abrasive grain are not limited to those in the embodiments. For example, a material such as $BaCO_3$ having mechanochemical action on silicon can be used serving as an abrasive grain.

For a supply liquid for wet polishing using the nozzle 3 shown in FIG. 1A, in addition to pure water, chemicals for wet-etching silicon, e.g., an aqueous KOH solution and ionized alkaline water can be used. An aqueous surface-active agent solution can also be used. Using the chemicals, an advantage in that the polishing rate or polishing characteristics such as surface flatness are increased depending on the material and grain size of an abrasive grain can be expected.

To remove the dust generated during the polishing operation according to the polishing apparatus, the method for blowing a gas onto the device surface from the nozzles 6a is used in the embodiment of FIG. 1A. It is also possible to let a liquid such as pure water run on the device surface.

Figure 10:
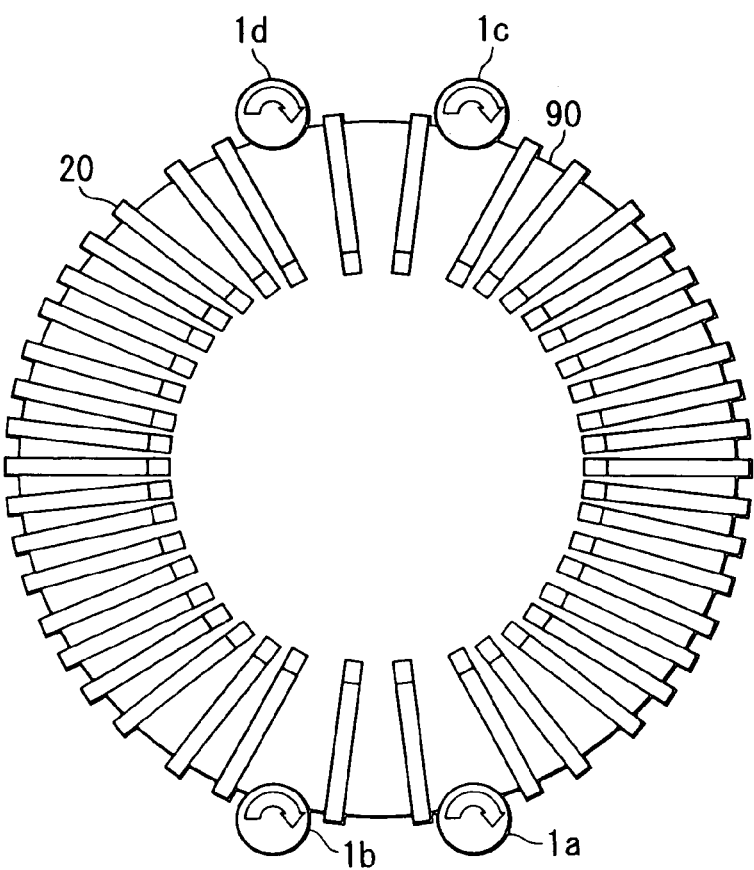
FIG. 10 is a plan view schematically showing the configuration of a polishing apparatus according to a still further embodiment of the present invention.

FIG. 10 shows a schematic diagram showing a polishing apparatus according to a still further embodiment of the present invention. The diagram shows a state in which a wafer 90 is set in the polishing apparatus, the state being observed from above. The same components as those in FIGS. 1A and 1B are designated by the same reference numerals and a detailed explanation is omitted.

The present polishing apparatus according to the present embodiment differs from that according to the first embodiment of FIGS. 1A and 1B with respect to a point that a long strip abrasive, namely, an abrasive strip 20 is used instead of the abrasive film. The abrasive strip 20 is formed in such a manner that abrasive grains of diamond are bonded on the surface of the strip comprising a polymer resin such as PET or polyester using an adhesive. The most possible number of abrasive strips 20 are arranged so as to be in contact with the periphery of the wafer 90, thus effectively increasing the polishing rate.

In the case of the FIG. 10 embodiment, the width of each abrasive strip 20 is small and the contact area thereof contacting the periphery of the wafer 90 can be deemed as a flat surface. Therefore, such a method has advantages in that an elastic cover, which is voluntarily used for the method using the abrasive film and is used to allow a contact portion to be fitted to the periphery of the wafer, is not needed.

Preferably, the section of the abrasive strip 20 is shaped into a rectangle and the long sides thereof are come into contact with the surfaces of the wafer because the contact distance is long in the viewpoint of twist prevention and an increase of the polishing rate.

Figure 11A:
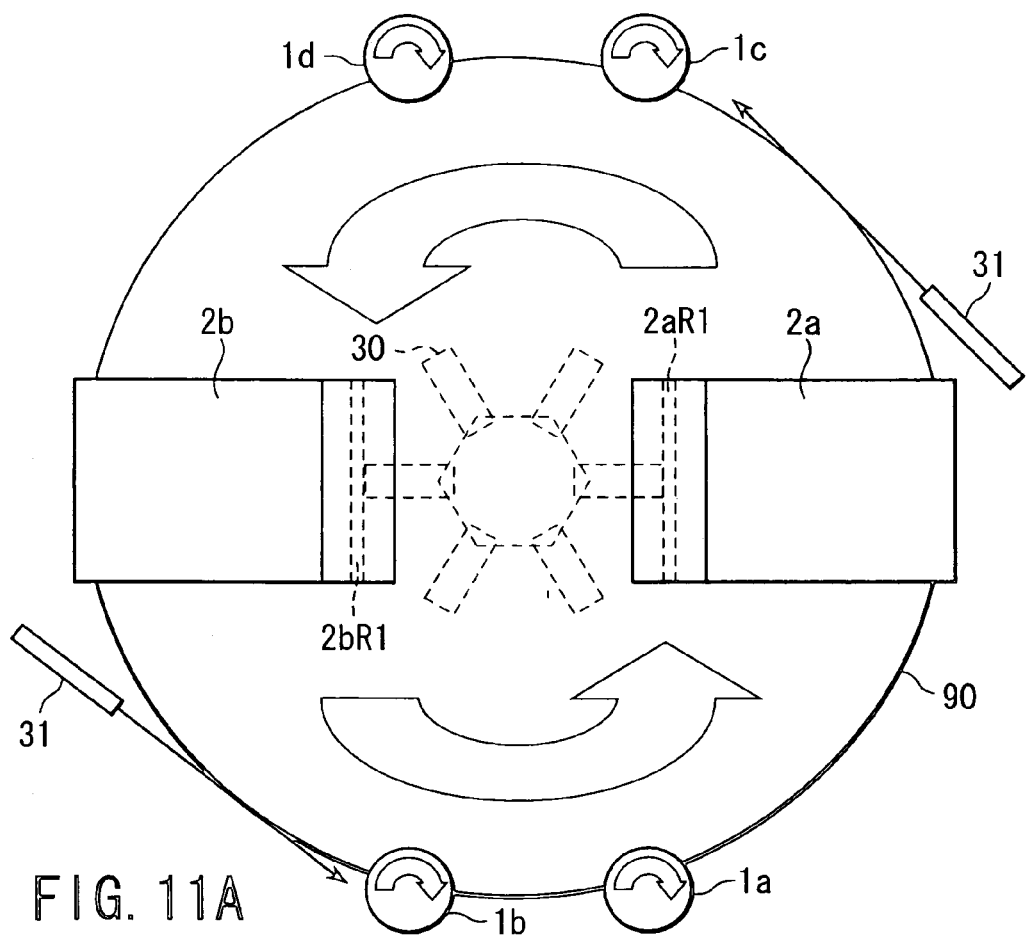
FIG. 11A is a schematic plan view showing a polishing apparatus according to a further embodiment of the present invention.
Figure 11B:
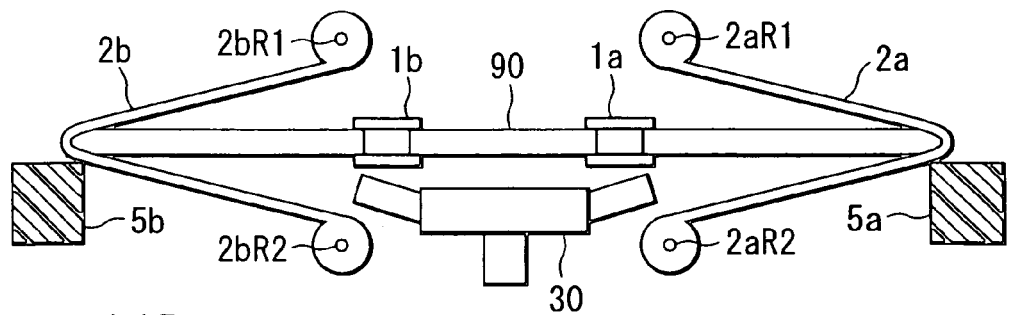
FIG. 11B is a schematic side view of the polishing apparatus shown in FIG. 11A embodiment.

FIGS. 11A and 11B are schematic diagrams showing a polishing apparatus according to a further embodiment of the present invention. FIG. 11A is the schematic diagram of a state in which a wafer 90 is set in the polishing apparatus, the state being observed from above. FIG. 11B is the schematic diagram of the state observed from one side. The same components as those in FIGS. 1A and 1B are designated by the same reference numerals and a detailed explanation is omitted.

The polishing apparatus according to the present embodiment differs from that according to the first embodiment of FIGS. 1A and 1B with respect to a point that dry polishing is used instead of wet polishing. In the dry polishing, generally, particles such as polishing dust are apt to electrostatically deposit on the wafer 90. Particularly, in the dry polishing, the particles may be scattered. Accordingly, the device surface may be contaminated by the particles.

According to the present embodiment, in order to remove polishing dust generated upon polishing, gas injection nozzles 30 for blowing a gas such as air or nitrogen are provide for the polishing apparatus. Specifically, the gas injection nozzles 30 are disposed in a radial fashion below the wafer 90 in order to eliminate the particles scattered on the device surface. The nozzles 30 are similar to those nozzles 6a shown in FIGS. 1A and 1B.

The gas injection radial nozzles 30 are disposed on a position corresponding to the center of the device surface and radially applies airflow to the device surface at a flow rate of 5 m/sec or higher so that the airflow is incident on the device surface at a small angle. Consequently, polishing dust can be effectively eliminated. It is more effective that another gas injection radial nozzles (not shown) are also arranged above the rear surface of the wafer 90 in addition to the nozzles 30 below the device surface.

Further, just after polishing, particles electrostatically deposited on the bevel plane are removed by airflow supplied from tangential gas injection nozzles 31. Specifically, airflow at a flow rate of 10 m/sec or higher is applied to the periphery of the wafer 90 just after polishing using the abrasive films 2a and 2b in the wafer rotating direction along a tangent to the periphery of the wafer 90.

The use of dry polishing can save liquid such as pure water supplied from the nozzle 3 shown in FIG. 1A. Thus, waste water disposal is also not needed. In the case of polishing actively using solid phase reaction such as mechanochemical action, it is generally well-known that the polishing rate of dry polishing is higher than that of wet polishing. Therefore, when abrasive grains of $BaCO_3$ having the mechanochemical action on silicon are used in the abrasive films 2a and 2b, dry polishing according to the present embodiment is effectively used.

When a Ru film used serving as a capacitor electrode (lower electrode) of a stacked capacitor is formed on a device surface using the CVD method, the Ru film is deposited on the bevel and the edge of a wafer to cause contamination. An embodiment of the present invention, removing the Ru film using the polishing method will now be described. When the Ru film is formed serving as a plug or a wire, it is obvious that the similar problems occur.

Figure 12:
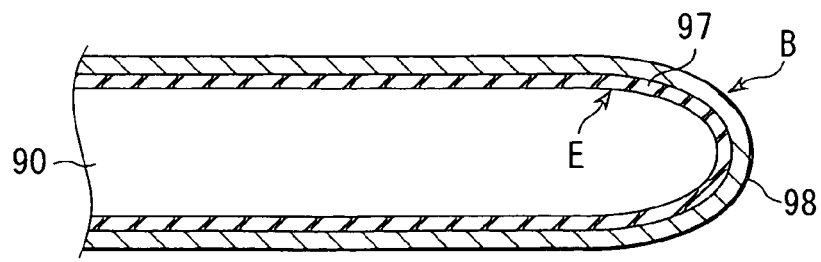
FIG. 12 is a sectional view showing the surface structure of a Si wafer subjected to processing of forming a Ru film in a semiconductor device manufacturing method according a further embodiment of the present invention.

As shown in FIG. 12, a Ru film 98 serving as a lower capacitor electrode is formed on a silicon nitride film 97 on a wafer 90 in a thickness of 30 nm using a batch type CVD method. In this case, the Ru film 98 is also formed on the device surface, the bevel, the edge, and the rear surface of the wafer 90 in a thickness of about 30 nm. For example, this type of Ru film 98 is used to form a cubic capacitor electrode such as a cylinder-type electrode or a crown-type electrode. This type of cubic capacitor is used in, for instance, a DRAM or a FeRAM.

It is necessary to remove the Ru film 98 deposited on the bevel B, the edge E, and the rear surface of the wafer 90 because the Ru film causes contamination in the in the subsequent processing. The Ru film 98 formed on the bevel B and the edge E was removed using the polishing apparatus according to the first embodiment shown in FIGS. 1A and 1B. Polishing conditions are as follows.

Abrasive films (2a, 2b): each film was formed in such a manner that diamond having a grain size of #10000 was bonded on a PET film using a polyurethane type adhesive. The films each having a width of 3 cm were arranged at eight positions so as to be in contact with the periphery of the wafer 90 having a diameter of 20.32 cm (8 inches).

Contact force: pressure of each elastic cover (4a, 4b) was set to 1 kgf.

Angle θ: 30 degrees.

Number of wafer revolution: 100 rpm.

Polishing liquid: pure water (supplied at 10 ml/min per nozzle).

Polishing was performed for one minute. Thus, the Ru film 98 deposited on the bevel B and the edge E was removed completely.

Subsequently, the Ru film 98 deposited on the bevel and the edge of a notch (not shown) of the wafer was removed using the diamond grinding wheel in the same way as the first embodiment of FIGS. 1A and 1B. The diamond grinding wheel was rotated at 1000 rpm and polishing was performed for 30 seconds. Thus, the Ru film 98 in the notch was completely removed.

Figure 13A:
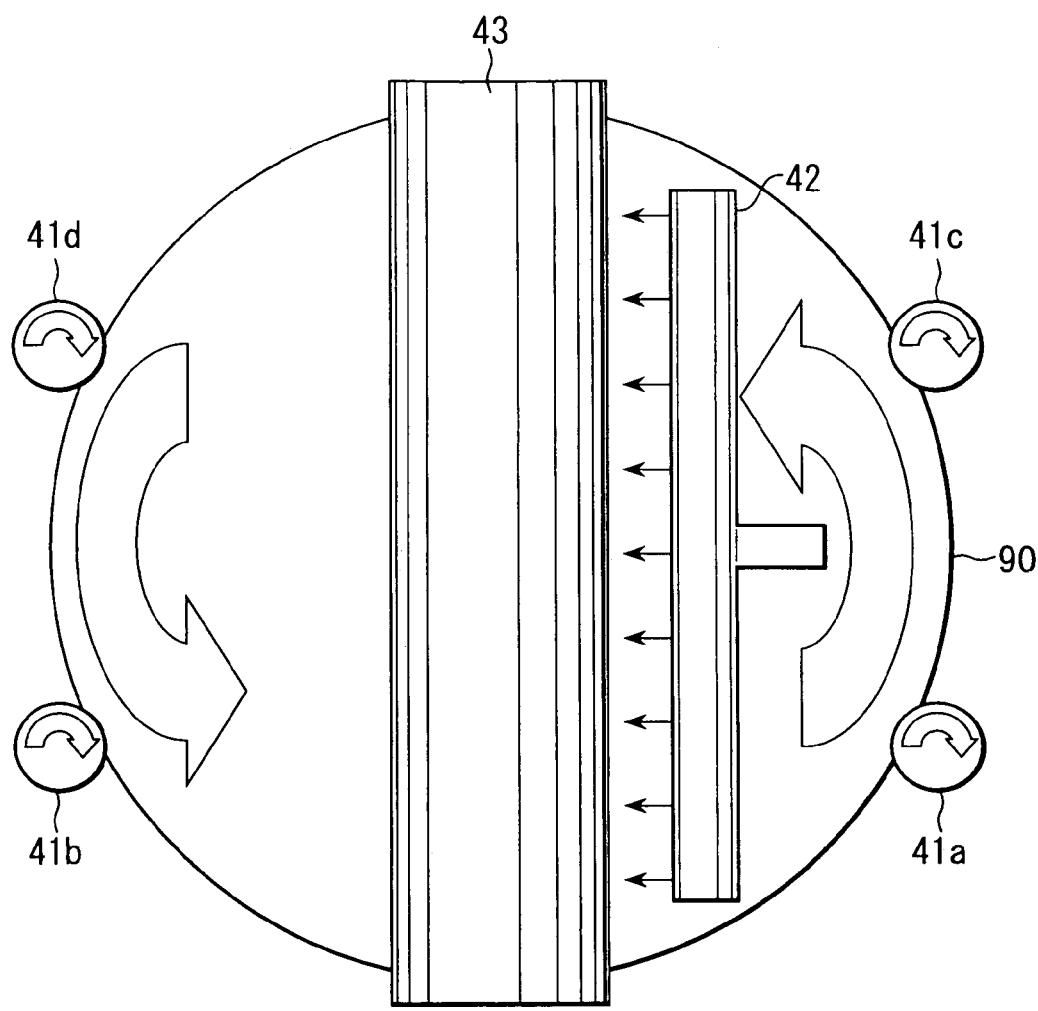
FIG. 13A is a schematic plan view showing a polishing apparatus according to a further embodiment of the present invention.
Figure 13B:
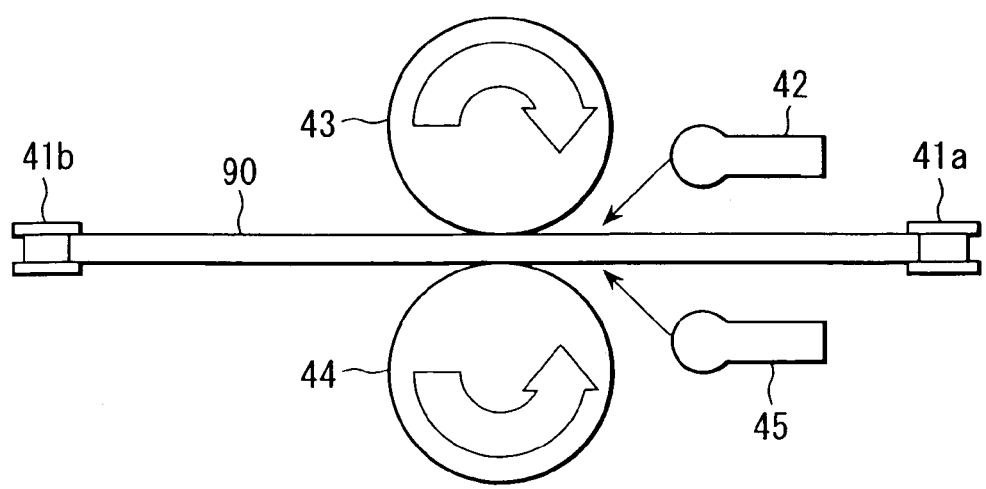
FIG. 13B is a schematic side view of the polishing apparatus according to the embodiment shown in FIG. 13A, the apparatus being observed from one side.

The Ru film 98 deposited on the rear surface of the wafer 90 is removed using a polishing apparatus shown in FIGS. 13A and 13B according to the still further embodiment of the present invention. FIG. 13A is a schematic diagram showing a state in which the wafer 90 is set in the polishing apparatus, the state being observed from above. FIG. 13B is a schematic diagram showing the state observed from one side.

The Si wafer 90 is set so that the device surface faces downward. The wafer 90 is held rotatably in a horizontal plane by rollers 41a to 41d. A polishing liquid supply nozzle 42 which is a shower nozzle drops pure water on the rear surface of the wafer 90. An abrasive film roll 43, formed in such a manner that an abrasive film is rolled around an elastic member, is come into contact with the rear surface of the wafer 90 while being rotated. Thus, the rear surface of the wafer 90 is subjected to wet polishing.

The abrasive film roll 43 is formed in such a manner that an abrasive film is adhered and rolled around cylindrical elastic rubber or urethane foam. When the roll 43 is used for a wafer of 20.32 cm (8 inches), the size of the roll 43 is may be set so that the diameter of the roll 43 is about 30 mm and the length thereof is about 210 mm.

A roll 44 formed of PVA sponge can be come into contact with the device surface of the Si wafer 90 while being rotated, with a cleaning fluid therebetween. The roll 44 functions to support the load of the abrasive film roll 43.

Polishing was performed using the above polishing apparatus under the following conditions.

Abrasive film: it was formed in such a manner that diamond having a grain size of #10000 was bonded on a PET film using a polyurethane type adhesive.

Pressing force of abrasive film roll 43: 1 kgf.
Number of revolution of abrasive film roll 43: 100 rpm.
Number of revolution of wafer: 100 rpm.
Polishing liquid: pure water (supply rate: at 200 ml/min).
Cleaning liquid: pure water (supply rate at 1000 ml/min).

Figure 14:
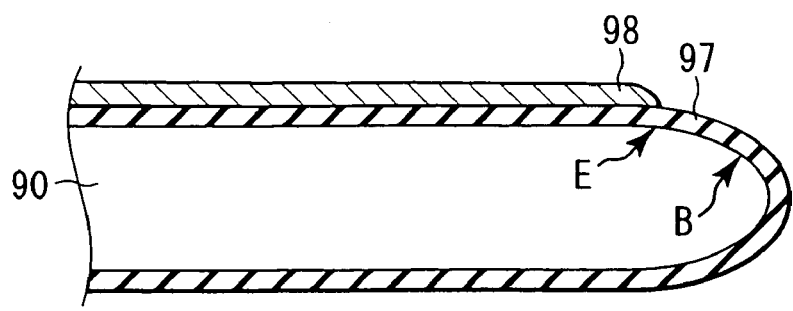
FIG. 14 is a sectional view showing the shape of the surface of a Si wafer whose rear surface is polished using the polishing apparatus shown in FIGS. 13A and 13B.

The Ru film 98 on the rear surface was also completely removed by polishing for two minutes as shown in FIG. 14.

After that, in another unit, the whole wafer 90 including the bevel plane B was rubbed with a PVA sponge and was then washed using pure water or an aqueous surface-active agent solution. Subsequently, the wafer was rinsed and was then dried. Thus, the removal of the Ru film on the bevel, the edge, and the rear surface of the wafer by polishing was finished.

It was confirmed that the exposed surface of the silicon nitride film 97 by removing the Ru film 98 was cleaned in a manner that Ru contamination measured using ICP (inductively coupled plasma) spectrometry was reduced to a level lower than $10^{10}$ atoms/cm$^2$.

In the conventional wet etching method, for example, when a 20% aqueous diammonium cerium nitrate solution is used serving as a chemical, it takes five minutes or longer until Ru contamination is reduced so as to be lower than $10^{11}$ atoms/cm$^2$. In order to reduce Ru contamination so as to be lower than $10^{10}$ atoms/cm$^2$, it is necessary to perform wet etching to the silicon nitride film 97 serving as a base using another chemical such as diluted hydrogen fluoride for two minutes. Therefore, in the conventional method, removing the Ru film on the bevel, the edge, and the rear surface of one wafer requires seven minutes or longer.

On the other hand, in the removing method using polishing according to the above-mentioned embodiment of the present invention, when the bevel and the edge of the wafer are polished together and the rear surface thereof is separately polished, it takes 3.5 minutes. The apparatus for the bevel and the edge (FIGS. 1A and 1B) and the apparatus for the rear surface (FIGS. 13A, 13B) can be integrated with each other so as not to interfere each other.

When the apparatuses are incorporated with each other, the Ru film on the bevel and the edge and that on the rear surface can be simultaneously removed by polishing. Consequently, processing time can be further reduced to 2.5 minutes, resulting in the remarkable improvement of throughput.

According to the embodiment of the present invention, the polishing apparatus embodying the polishing method has the simple arrangement. Accordingly, the cost of the discrete apparatus is inexpensive. Since the raw materials to be used are pure water and a small amount of chemicals, the running cost can be remarkably reduced.

An in-situ monitor mechanism for monitoring a polishing state during polishing and feeding back the monitor result into the polishing operation can also be mounted on the present embodied polishing apparatus. Serving as the monitor mechanism, for example, a mechanism for measuring a change in electric resistance, the change being accompanied with a change in thickness of the Ru film is preferably used.

The monitor mechanism can be constituted by two terminals made of a conductive resin, which does not damage a wafer even if the resin terminal is come into contact with the rotating wafer, a voltage source for applying a voltage between the terminals, and a current measuring unit for measuring or monitoring a current flowing between the terminals, namely, a current flowing through the Ru film.

As polishing proceeds, the Ru film becomes thinner and the electric resistance becomes higher. Thus, a current value becomes smaller. When the Ru film is completely removed and an insulating film of the silicon nitride film serving as the base is exposed, the current value is equal to zero. Such processing time is added to processing time to grind the Ru component diffused in the base to determine the final point of polishing.

To monitor removing the Ru film on the bevel, the shape or position of the terminal is set so as to be in contact with the bevel. To monitor removing the Ru film on the rear surface, the shape or position of the terminal is set so as to be in contact with the rear surface. Since the terminals are in contact with the surfaces of the rotating wafer, preferably, each terminal is pushed by a spring or the terminal itself is made of an elastic member in order to prevent the disconnection of the contact.

In consideration of effects on a device on the wafer, a voltage to be applied is set to a value as small as possible, preferably, on the order of mV or lower. Preferably, a DC voltage is not used. Advantageously, when an AC voltage or a high-frequency voltage is used, the detected current waveforms can be easily amplified or smoothed.

The configuration of the polishing apparatus according to the embodiments can be modified within the spirit and scope of the present invention without departing from the essence thereof. Processing conditions in polishing can be changed as necessary. The shape of the abrasive film and the kind of abrasive grain are not limited to those of the present embodiments.

For supply liquids for wet polishing, in addition to pure water, chemicals for wet etching the Ru film, for example, oxidants such as an aqueous diammonium cerium nitrate solution and an aqueous ammonium persulfate solution can also be used. When the chemicals are used, an advantage in that the polishing rate is increased can be expected.

The features of the removal of a contaminant film using the polishing method include the addition of the mechanical removing action of abrasive grains. Therefore, even a chemically stable film is effectively removed. The component of the chemically stable film, the component being spread in the base, can also be removed by grinding a part of the base. Consequently, a contaminant film which can be removed by the embodied polishing method is not limited to the Ru film. General films made of new materials which will be introduced to the manufacture of semiconductor devices, for example, a Cu film, a PZT film, and a BST film can also be removed.

According to the described embodiment, the lower electrode of the stacked capacitor has been described serving as a part of an element of a semiconductor device. A plug or a wire, or two or more parts among the electrode, the plug, and the wire can also be used.

The present invention is not limited to the above embodiments. For example, in the above embodiments, the case where the Si wafer was used serving as the substrate has been described. An SOI wafer can also be used. Further, another semiconductor wafer such as a SiGe wafer, or a Si wafer whose device surface comprises SiGe can also be used.

As mentioned above in detail, according to the embodiments of the present invention, a semiconductor device manufacturing method whereby an unnecessary matter formed or deposited on the periphery and the rear surface of a substrate can be effectively removed during manufacturing of a semiconductor device, and a polishing apparatus can be realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A polishing apparatus, comprising:
a polishing member having a polishing face configured to contact at least a periphery of a substrate, the periphery including a bevel portion between a top surface plane and a bottom surface plane of the substrate;
an elastic member including end portions and being configured to press the polishing member around the periphery of the substrate at an angle less than 90 degrees with respect to the top and bottom surface planes of the substrate; and
a supporting member including supporting portions for supporting the end portions of the elastic member and a recess formed between the supporting portions, the recess being configured for receiving the periphery of the substrate with the polishing member and the elastic member being inserted between the bevel portion of the substrate and an inner wall of the recess and with a space being defined between a back surface of the elastic member opposing with another surface contacting the polishing member and the inner wall of the recess,
wherein the elastic member is configured to generate tension to press the polishing member when the elastic member is held into the recess of the supporting member.

2. The apparatus according to claim 1, wherein the elastic member includes an elastic cover pressing the polishing member to the periphery of the substrate.

3. The apparatus according to claim 2, further comprising:
a fixed rigid member pressing the elastic cover to the periphery of the substrate.

4. The apparatus according to claim 1, further comprising:
at least one mechanism applying airflow to the substrate and a mechanism supplying a liquid onto the substrate.

5. The apparatus according to claim 1, wherein the polishing member has a long tape-shaped form in which one end is rolled around a supply roller and the other end is rolled around a take-up roller.

6. The apparatus according to claim 1, wherein the polishing member includes an abrasive film used in a bonded abrasive system.

7. The apparatus according to claim 5, wherein the supply roller and the take-up roller are provided above and below the plane of the substrate, respectively.

* * * * *